(12) United States Patent
Baek et al.

(10) Patent No.: US 11,137,645 B2
(45) Date of Patent: Oct. 5, 2021

(54) ELECTRONIC APPARATUS

(71) Applicant: Samsung Display Co., Ltd., Yongin-si (KR)

(72) Inventors: Seung Hwan Baek, Seoul (KR); Jeongjin Kim, Cheonan-si (KR); Jeong Bong Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 56 days.

(21) Appl. No.: 16/565,192

(22) Filed: Sep. 9, 2019

(65) Prior Publication Data
US 2020/0174295 A1    Jun. 4, 2020

(30) Foreign Application Priority Data

Nov. 29, 2018  (KR) .................. 10-2018-0151195

(51) Int. Cl.
| | | |
|---|---|---|
| *G02F 1/13357* | (2006.01) | |
| *G02F 1/1339* | (2006.01) | |
| *G02F 1/1333* | (2006.01) | |
| *H01L 51/52* | (2006.01) | |
| *G02F 1/135* | (2006.01) | |

(52) U.S. Cl.
CPC ...... *G02F 1/1339* (2013.01); *G02F 1/133308* (2013.01); *H01L 51/5253* (2013.01); *G02F 1/1351* (2021.01)

(58) Field of Classification Search
CPC . G02F 1/1339; G02F 1/133308; G02F 1/1351
USPC ......................................... 313/506
See application file for complete search history.

(56) References Cited

U.S. PATENT DOCUMENTS

| | | | |
|---|---|---|---|
| 8,169,563 B2* | 5/2012 | Lee ................... | G02F 1/133308 349/58 |
| 9,853,232 B2 | 12/2017 | Shin et al. | |
| 10,768,356 B1* | 9/2020 | Zhang ................. | G02B 6/0035 |
| 10,818,742 B2* | 10/2020 | Park .................... | H01L 51/0096 |
| 10,877,207 B1* | 12/2020 | Li ....................... | G02F 1/133608 |
| 2014/0293141 A1* | 10/2014 | Tsubokura ............ | B60K 35/00 349/1 |
| 2016/0011633 A1 | 1/2016 | Watanabe et al. | |

(Continued)

FOREIGN PATENT DOCUMENTS

| | | |
|---|---|---|
| KR | 10-2017-0111827 A | 10/2017 |
| KR | 10-2018-0063633 A | 6/2018 |

*Primary Examiner* — Christopher M Raabe
(74) *Attorney, Agent, or Firm* — Lewis Roca Rothgerber Christie LLP

(57) ABSTRACT

An electronic apparatus includes: an electronic module; a display module having an active area overlapping a pixel and a peripheral area adjacent to the active area, a module opening being defined in the display module from a back surface to a front surface thereof in the active area and overlapping the electronic module; a cover glass having a transmissive area, at least a portion of which overlaps the active area, and a bezel area adjacent to the transmissive area and on the front surface of the display module; an adhesive layer between the display module and the cover glass and having a first opening overlapping the electronic module; and a protective layer on the back surface of the display module and having a second opening overlapping the electronic module. The electronic module is spaced apart from the adhesive layer on a plane.

18 Claims, 16 Drawing Sheets

(56) References Cited

U.S. PATENT DOCUMENTS

| | | | |
|---|---|---|---|
| 2016/0161664 A1* | 6/2016 | Ishida | G02B 6/0061 |
| | | | 359/230 |
| 2017/0059771 A1* | 3/2017 | Yuki | G02B 6/0088 |
| 2017/0287992 A1 | 10/2017 | Kwak et al. | |
| 2017/0336553 A1* | 11/2017 | Yuki | G02B 6/0031 |
| 2018/0157362 A1 | 6/2018 | Kim et al. | |
| 2019/0072822 A1* | 3/2019 | Yasunaga | G02B 6/0035 |
| 2019/0227218 A1* | 7/2019 | Kawano | G02B 6/0051 |
| 2019/0243417 A1* | 8/2019 | Cheng | H04M 1/0264 |
| 2019/0306296 A1* | 10/2019 | Cheng | H04M 1/0264 |

* cited by examiner

ELECTRONIC APPARATUS

CROSS-REFERENCE TO RELATED APPLICATION

This application claims priority to and the benefit of Korean Patent Application No. 10-2018-0151195, filed on Nov. 29, 2018 in the Korean Intellectual Property Office (KIPO), the entire content of which is hereby incorporated by reference.

BACKGROUND

1. Field

Aspects of embodiments of the present disclosure herein relate to an electronic apparatus.

2. Description of the Related Art

An electronic apparatus is activated by an electrical signal. An electronic apparatus may include a display module including a display panel for displaying an image and an input sensing unit for sensing an external input. As one example of the display module, an organic light emitting display panel has relatively low power consumption, high brightness, and high reaction speed. To form an electronic apparatus, the display module may be accommodated in a cover case along with other components. For example, an electronic apparatus may further include an electronic module for receiving an external signal and/or for providing an output signal to the outside (e.g., to an external device).

SUMMARY

Embodiments of the present disclosure provide a display module and an electronic apparatus including the same. The display module may prevent various defects from being visually recognized by a user (e.g., may prevent or substantially prevent various defects from being visible to a user) by using an adhesive layer to adhere the display module to a cover glass in a region in which an electronic module is disposed.

An embodiment of the inventive concept provides an electronic apparatus including: an electronic module including at least one of a sound output module, a light emitting module, a light receiving module, or a camera module; a display module having an active area overlapping a pixel and a peripheral area adjacent to the active area, the display module having a front surface and a back surface opposite to the front surface, a module opening being defined in the display module from the back surface to the front surface in the active area and overlapping the electronic module; a cover glass having a transmissive area, at least a portion of which overlaps the active area, and a bezel area adjacent to the transmissive area and on the front surface of the display module; an adhesive layer between the display module and the cover glass and having a first opening overlapping the electronic module; and a protective layer on the back surface of the display module and having a second opening overlapping the electronic module. The electronic module is spaced apart from the adhesive layer on a plane.

A portion of the front surface adjacent to the module opening may be exposed through the first opening in the adhesive layer.

A width in one direction of the first opening may be greater than a width in one direction of the module opening.

A width in one direction of the module opening may be greater than a width in one direction of the second opening.

The protective layer may include a print layer for reflecting light incident from the outside.

The print layer may be on a portion of a surface of the protective layer that is exposed through the module opening of the display module.

The display module may include a cover layer on the back surface of the display module, and the cover layer may include at least one of a light blocking layer, a heat dissipating layer, or a cushion layer.

The module opening may have a bar shape extending in one direction on a plane or a circular shape.

The electronic module may be provided in plurality, and the electronic modules may be spaced apart from each other in the module opening.

The first opening may be defined by a side surface of the adhesive layer that is exposed by the penetration of the first opening through the adhesive layer, and the side surface may have a non-uniform shape.

The cover glass may include a bezel layer in the bezel area.

The adhesive layer may include at least one of an optical clear adhesive (OCA), a pressure sensitive adhesive (PSA), or an optical clear resin (OCR).

The electronic apparatus may further include an input sensing unit on the display module for sensing an external input. The display module may include a plurality of insulation layers on which the pixel is arranged, the display module may have a groove in the insulation layers in the thickness direction of the display module, and the groove may have a closed line shape extending around the module opening.

An embodiment of the inventive concept provides an electronic apparatus including: a display module having an active area in which a pixel is arranged and a peripheral area adjacent to the active area, the display module having a front surface and a back surface opposite to the front surface, a module opening extending through the display module from the back surface to the front surface in the active area; a cover glass having a transmissive area, at least a portion of which overlaps the active area, and a bezel area adjacent to the transmissive area and on the front surface of the display module; an adhesive layer between the display module and the cover glass and having a first opening overlapping the module opening; and a protective layer on the back surface of the display module and having a second opening overlapping the module opening. A width in one direction of the first opening is greater than a width in one direction of the module opening.

The electronic apparatus may further include an electronic module overlapping the module opening. The electronic module may be spaced apart from the adhesive layer on a plane.

A portion of the front surface adjacent to the module opening may be exposed through the adhesive layer at the first opening.

The protective layer may include a print layer for reflecting light incident from the outside.

An embodiment of the inventive concept provides an electronic apparatus including: a display module having an active area in which a pixel is arranged and a peripheral area adjacent to the active area, the display module having a front surface and a back surface opposite to the front surface, a module opening being defined through the display module from the back surface to the front surface in the active area; a cover glass having a transmissive area, at least a portion of which overlaps the active area, and a bezel area adjacent to the transmissive area and on the front surface of the display module; an adhesive layer between the display module and the cover glass and having a first opening overlapping the module opening; and a protective layer on the back surface of the display module and having a second opening overlapping the module opening. A portion of the front surface of the display module adjacent to the module opening is exposed through the adhesive layer at the first opening.

A width in one direction of the first opening may be greater than a width in one direction of the module opening.

The electronic apparatus may further include an electronic module overlapping the module opening, and the electronic module may be spaced apart from the adhesive layer on a plane.

BRIEF DESCRIPTION OF THE FIGURES

The accompanying drawings are included to provide a further understanding of the inventive concept and are incorporated in and constitute a part of this specification. The drawings illustrate exemplary embodiments of the inventive concept and, together with the description, explain aspects and features of the inventive concept. In the drawings.

DETAILED DESCRIPTION

Figure 1A:
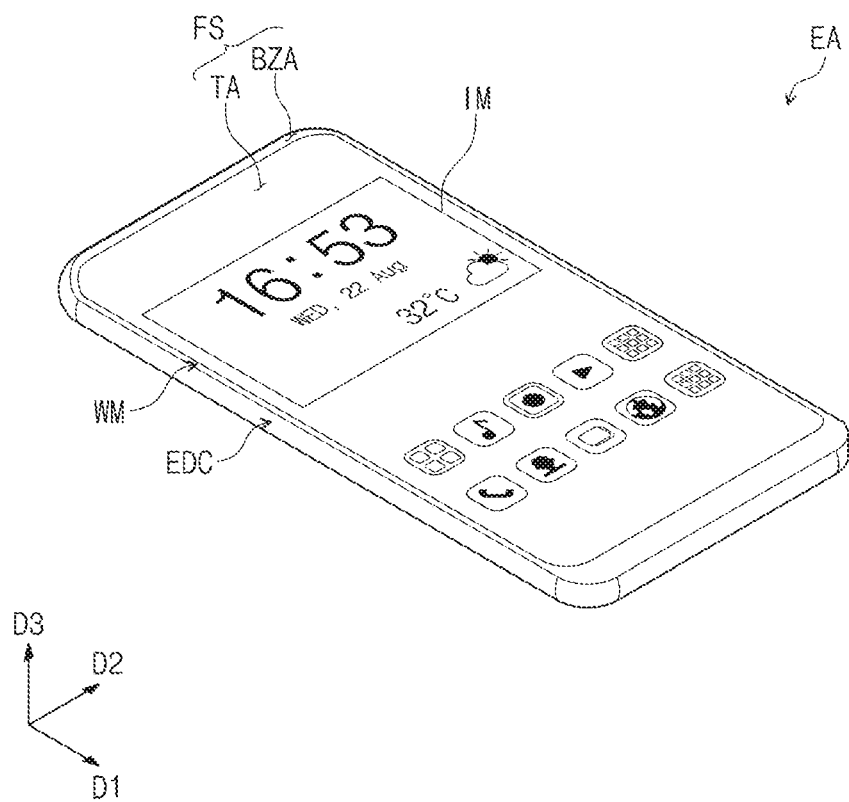
FIG. 1A is an assembled perspective view of an electronic apparatus according to an embodiment of the inventive concept.

In the present disclosure, when an element (or a region, a layer, a portion, etc.) is referred to as being "on," "connected to," or "coupled to" another element, the element may be directly on/connected to/coupled to the other element or a third element may be disposed therebetween.

Like reference numerals refer to like elements. Also, in the drawings, the thickness, ratio, and dimensions of elements may be exaggerated for an effective description of technical contents.

As used herein, the term "and/or" includes any and all combinations of one or more of the associated listed items.

It will be understood that, although the terms "first", "second", etc. may be used herein to describe various elements, these elements should not be limited by these terms. These terms are only used to distinguish one element from another. For example, a first element could be termed a second element, and similarly, a second element could be termed a first element, without departing from the scope of example embodiments of the inventive concept. As used herein, the singular forms "a" and "an" are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art and, unless they are expressly defined herein, they should not be interpreted in an ideal or overly formal sense.

It will be further understood that the terms "includes," "including," "comprises," "comprising," and/or "having" and the like, when used in this specification, specify the presence of stated features, integers, steps, operations, elements, and/or components but do not preclude the presence or addition of one or more other features, integers, steps, operations, elements, components, and/or groups thereof. Hereinafter, exemplary embodiments of the inventive concept will be described with reference to the accompanying drawings.

Figure 1B:
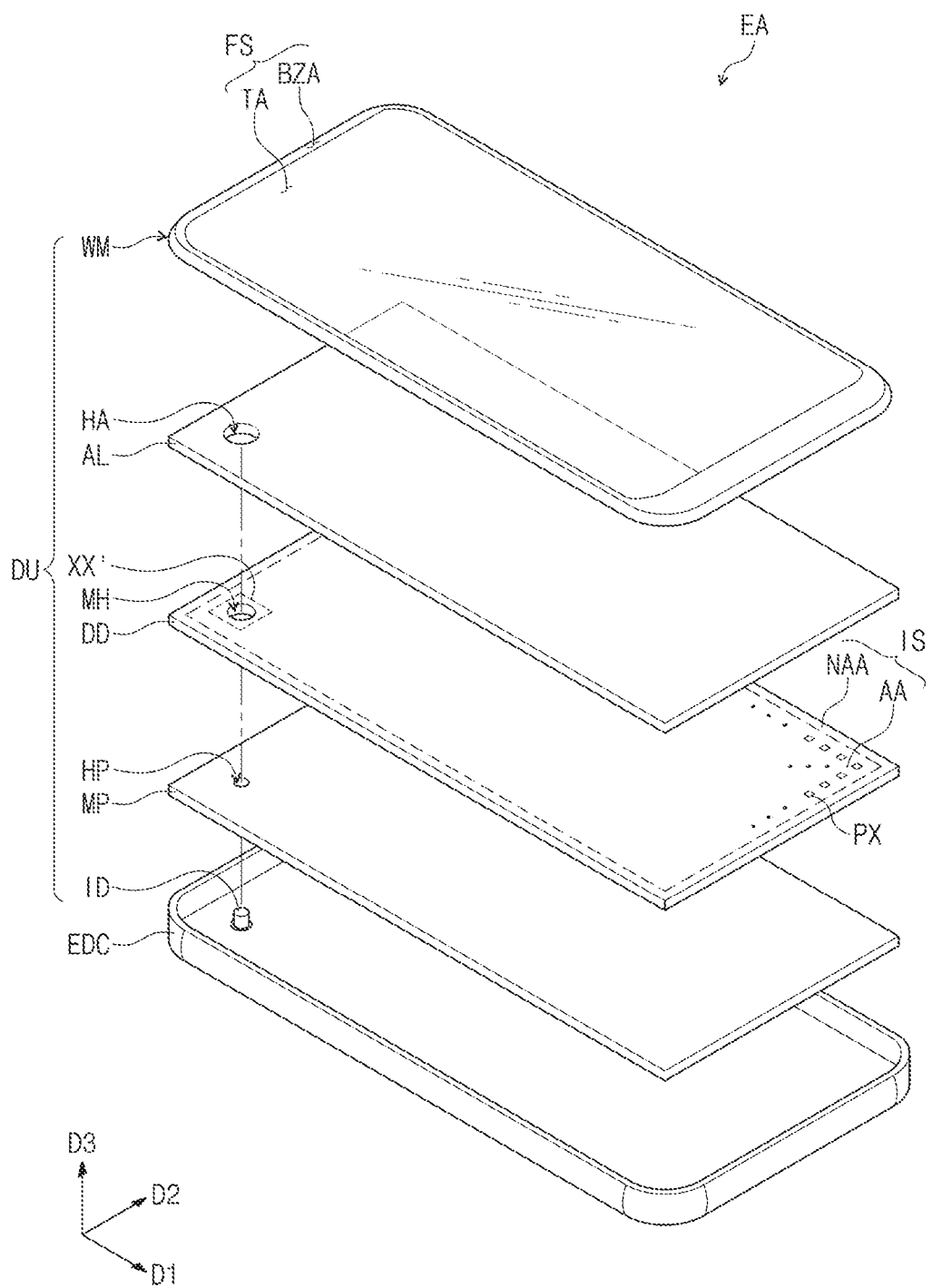
FIG. 1B is an exploded perspective view of the electronic apparatus shown in FIG. 1A.
Figure 1C:
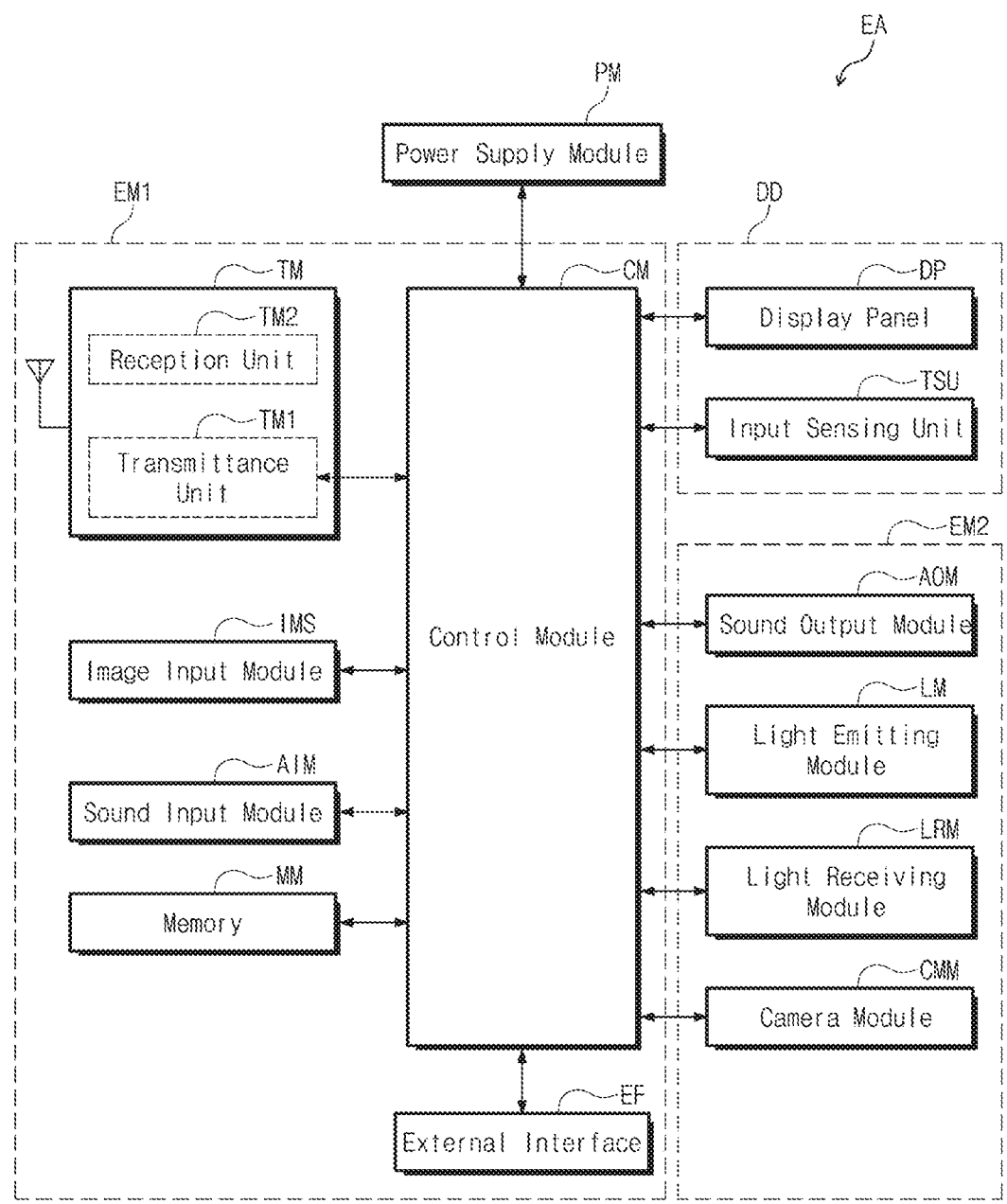
FIG. 1C is a block diagram of the electronic apparatus shown in FIGS. 1A and 1B.

FIG. 1A is an assembled perspective view of an electronic apparatus according to an embodiment of the inventive concept, FIG. 1B is an exploded perspective view of the electronic apparatus shown in FIG. 1A, and FIG. 1C is a block diagram of the electronic apparatus shown in FIGS. 1A and 1B. Hereinafter, with reference to FIG. 1A-1C, an electronic apparatus according to an embodiment of the inventive concept will be described.

Referring to FIGS. 1A and 1B, an electronic apparatus EA is configured to display an image IM on a plane defined by a first direction D1 and a second direction D2 and toward (or in) a third direction D3. The electronic apparatus EA includes a display unit DU and a cover case EDC. The display unit DU, according to an embodiment of the inventive concept, includes a cover glass WM, a display module DD, an adhesive layer AL, and a protective layer MP.

The cover glass WM is disposed on the display module DD and covers the entire surface IS of the display module DD. The cover glass WM includes a front surface FS exposed to the outside. An image displayed on the display module DD is viewed from the outside through the front surface FS.

The cover glass WM may have a single-layered structure or a multi-layered structure. For example, the cover glass WM may have a laminated structure in which a plurality of plastic films are adhered to each other with an adhesive or a laminated structure in which a glass substrate and a plastic film are adhered to each other with an adhesive. The cover glass WM may be optically transparent. For example, the cover glass WM may include glass or plastic.

The front surface FS of the cover glass WM may be divided into a transmissive area TA and a bezel area BZA on a plane. The transmissive area TA may be a region for transmitting light provided (or emitted) from a display module DD. The transmissive area TA may have a shape corresponding to an active area AA of the display module DD. For example, the transmissive area TA overlaps the entire or at least a portion of the active area AA. Accordingly, the image IM displayed on the active area AA of the display module DD may be viewed from the outside through the transmissive area TA.

The bezel area BZA may be a region having a relatively lower light transmittance than the transmissive area TA. The bezel area BZA defines the shape of the transmissive area TA. The bezel area BZA is adjacent to the transmissive area TA and may surround (e.g., may extend around a periphery of) the transmissive area TA.

The bezel area BZA may have a color (e.g., a predetermined color). The bezel area BZA may cover a peripheral area NAA of the display module DD to block the peripheral area NAA from being viewed from the outside. However, this is only an example, and in the cover glass WM according to another embodiment of the inventive concept, the bezel area BZA may be omitted.

The display module DD displays an image IM on the surface IS. The surface IS may be divided into the active area AA and the peripheral area NAA. The image IM is displayed on the active area AA, and the peripheral area NAA is adjacent to (e.g., surrounds a periphery of) the active area AA.

The display module DD may include a plurality of pixels PX. The pixels PX display light in response to an electrical signal. Light displayed by (or emitted by) the pixels PX implement (or form) the image IM.

In the illustrated embodiment, an opening (e.g., through-hole or predetermined opening or through-hole) may be defined in to pass through (e.g., to extend through) the display module DD. A module opening (e.g., a module hole) MH may be defined in the active area AA of the display module DD.

The module opening MH overlaps an electronic module ID on a plane. The module opening MH is defined in the active area AA. Accordingly, some of the pixels PX may be arranged surrounding (e.g., around the periphery of) the module opening MH such that the image IM is also displayed in a region adjacent to the module opening MH.

The electronic module ID may include various functional modules for operating (e.g., for controlling) the electronic apparatus EA. The electronic module ID may be electrically connected to the display module DD through a connector (e.g., a flexible printed circuit board or the like).

Referring to FIG. 1C, a power supply module PM supplies power for the overall operation of the electronic apparatus EA. The power supply module PM may include a battery module.

The electronic module ID according to an embodiment may include at least one of a first electronic module EM1 and a second electronic module EM2.

The first electronic module EM1 may be directly mounted on a mother board that is electrically connected to the display module DD, or may be mounted on a separate substrate and electrically connected to the mother board through a connector or the like.

The first electronic module EM1 may include a control module CM, a wireless communication module TM, an image input module IMS, a sound input module AIM, a memory MM, and an external interface EF. Some of the modules may not be mounted on the mother board but, instead, may be electrically connected to the mother board through, for example, a flexible printed circuit board.

The control module CM is configured to control the overall operation of the electronic apparatus EA. The control module CM may be a microprocessor. For example, the control module CM either activates or deactivates the display module DD. On the basis of (or according to) a touch signal received from the display module DD, the control module CM may control other modules, such as the image input module IMS or the sound input module AIM.

The wireless communication module TM may transmit/receive wireless signals with other terminals by using, for example, Bluetooth® (a registered trademark of Bluetooth Sig, Inc. of Kirkland, Wash.) or a Wi-Fi connection. The wireless communication module TM may transmit/receive voice signals by using a general communication line (e.g., a general communication connection or protocol). The wireless communication module TM includes a transmittance unit TM1 for modulating and transmitting a signal to be transmitted and a reception unit TM2 for demodulating a received signal.

The image input module IMS processes an image signal and converts the same into image data displayable on the display module DD.

The sound input module AIM receives an external sound signal through a microphone in a recording mode, a voice recognition mode, and the like and converts the received signal into electrical voice data.

The memory MM may store data received from the wireless communication module TM, the image input module IMS, and the sound input module AIM so as to use the data, and used data may be deleted therefrom. In addition, the memory MM may store or delete data for controlling the second electronic module EM2.

The external interface EF is an interface to be connected to an external charger, a wired/wireless data port, a card socket (e.g., a memory card, a SIM/UIM card), and the like.

The second electronic module EM2 may include a sound output module AOM, a light emitting module LM, a light receiving module LRM, a camera module CMM, and the like. The above components may be directly mounted on the mother board, may be mounted on a separate substrate and electrically connected to the display module DD through a connector, and/or may be electrically connected to the first electronic module EM1.

The sound output module AOM converts sound data received from the wireless communication module TM or sound data stored in the memory MM and outputs the converted data to the outside.

The light emitting module LM generates and outputs light. The light emitting module LM may output infrared light. The light emitting module LM may include an LED element. The light emitting module LM may sense infrared light. The light receiving module LRM may be activated when infrared light having a reference intensity or greater is sensed (e.g., when infrared light having a predetermined level or higher is sensed). The light receiving module LRM may include a CMOS sensor. After infrared light generated by the light emitting module LM is output, infrared light reflected by an external object (such as a user's finger or face) may be incident on the light receiving module LRM. The camera module CMM captures an image of a subject.

The electronic module ID according to an embodiment of the inventive concept may be one or more of the components of the second electronic module EM2. At this time, the other components of the first electronic module EM1 and the second electronic module EM2 may be disposed at different positions. For example, the electronic module ID may include at least the sound output module AOM, the light emitting module LM, the light receiving module LRM, or the camera module CMM.

The adhesive layer AL is disposed between the cover glass WM and the display module DD. The adhesive layer AL may adhere the cover glass WM to the display module DD.

The adhesive layer AL includes an adhesive material. For example, the adhesive layer AL may include at least one of an optical clear adhesive (OCA), a pressure sensitive adhesive (PSA), or an optical clear resin (OCR). The adhesive layer AL according to an embodiment of the inventive concept may be provided in the form of a film including an optical clear adhesive (OCA).

The adhesive layer AL according to an embodiment has a first opening HA defined therein. The first opening HA is defined by a side surface of the adhesive layer AL, the side surface being exposed by the penetration of the first opening HA through the adhesive layer AL. The first opening HA overlaps the module opening MH of the display module DD on a plane. Accordingly, the first opening HA overlaps the electronic module ID.

The protective layer MP is disposed between the display module DD and the cover case EDC. The protective layer MP may be disposed on a back surface of the display module DD to protect the display module DD. The protective layer MP may include a rigid metal. For example, the protective layer MP may be a plate including (or formed of) stainless steel.

The protective layer MP according to an embodiment has a second opening HP defined therein. The second opening HP is defined by a side surface of the protective layer MP, the side surface being exposed by the second opening HA penetrating the protective layer MP. The second opening HP overlaps the module opening MH and the first opening HA on a plane. Accordingly, the second opening HP overlaps the electronic module ID.

The cover case EDC may be coupled to the cover glass WM. The cover case EDC provides a back surface of the electronic apparatus EA. The cover case EDC is coupled to the cover glass WM to provide an internal space. The display module DD, the electronic module ID, and the various components shown in FIG. 1C may be accommodated in the internal space. The cover case EDC may include a rigid material. For example, the cover case EDC may include a plurality of frames and/or plates including (or made of) glass, plastic, or metal. The cover case EDC may stably protect the components of the electronic apparatus EA accommodated in the internal space from external impact.

Figure 2A:
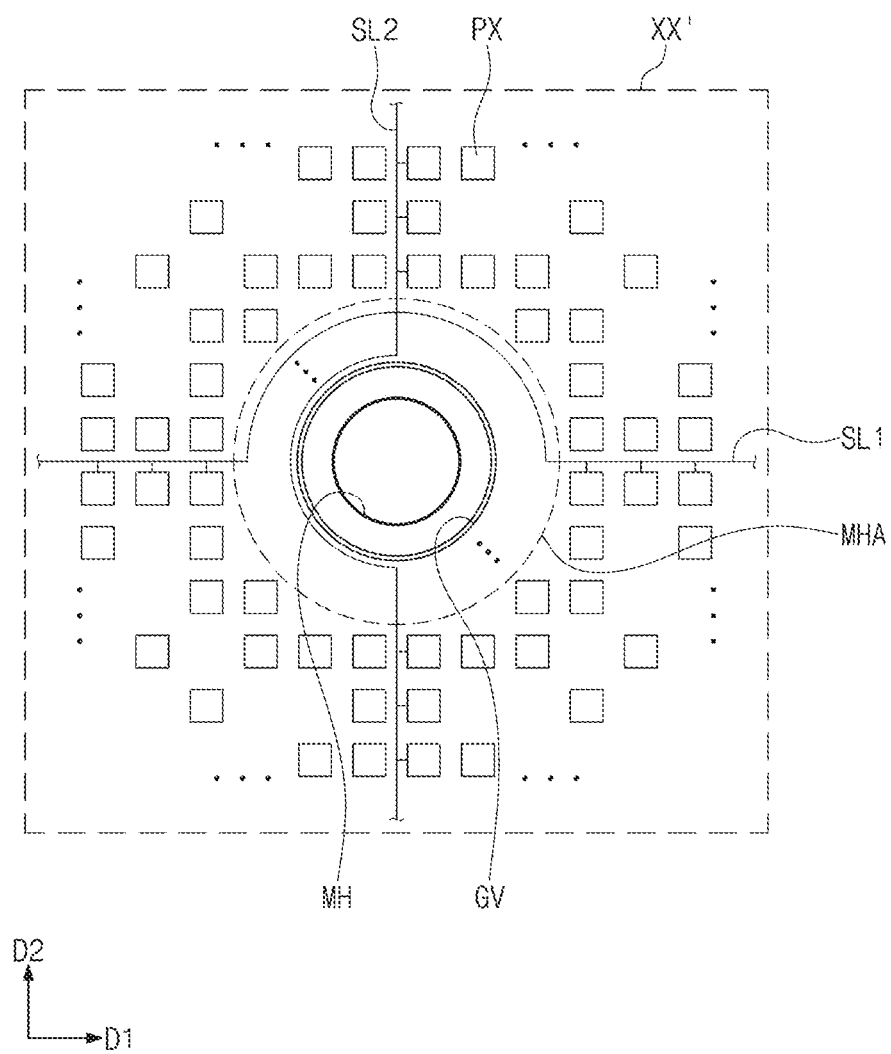
FIG. 2A is a plan view schematically showing the region XX' of FIG. 1B.
Figure 2B:
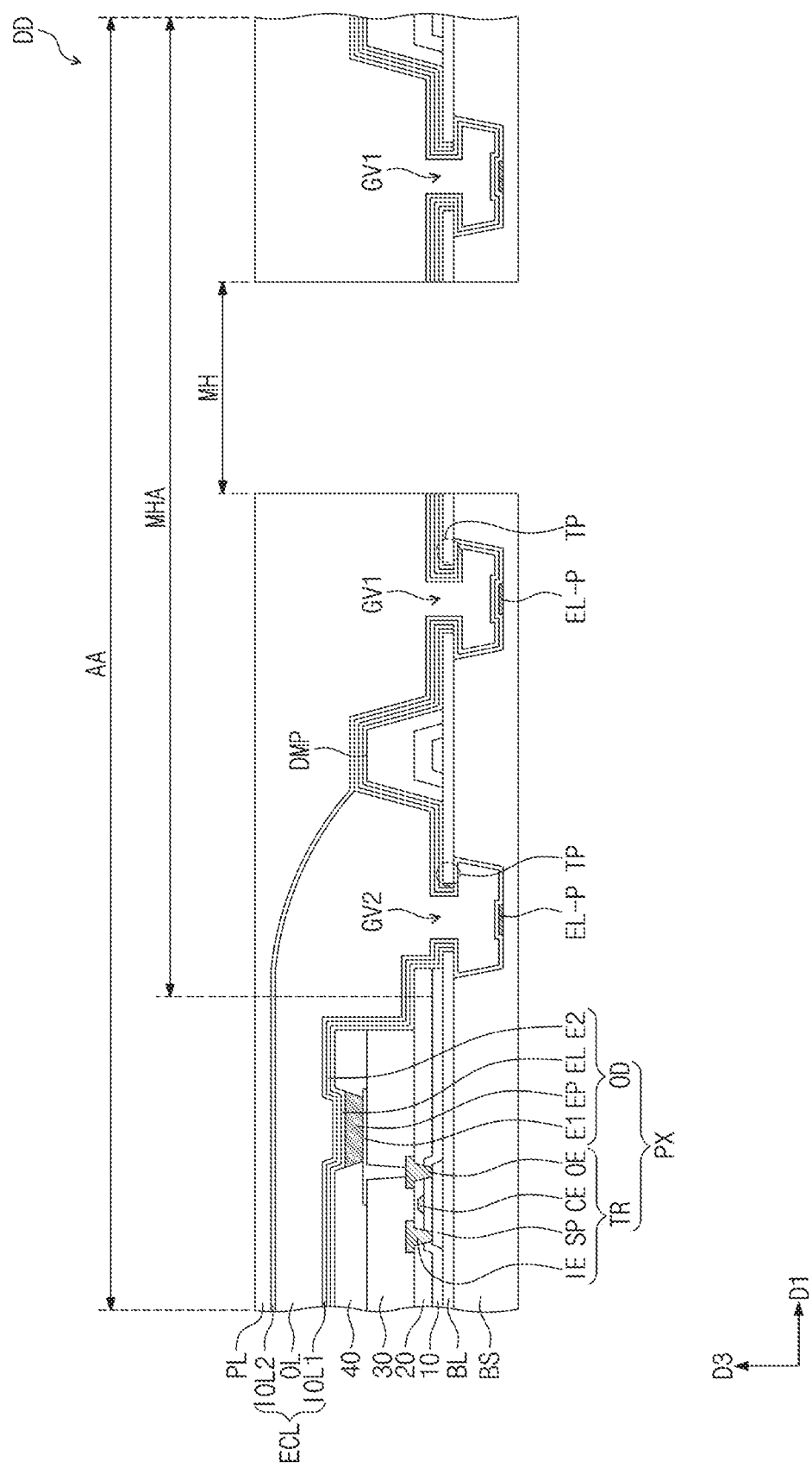
FIG. 2B is a cross-sectional view of a display unit according to an embodiment of the inventive concept.
Figure 2C:
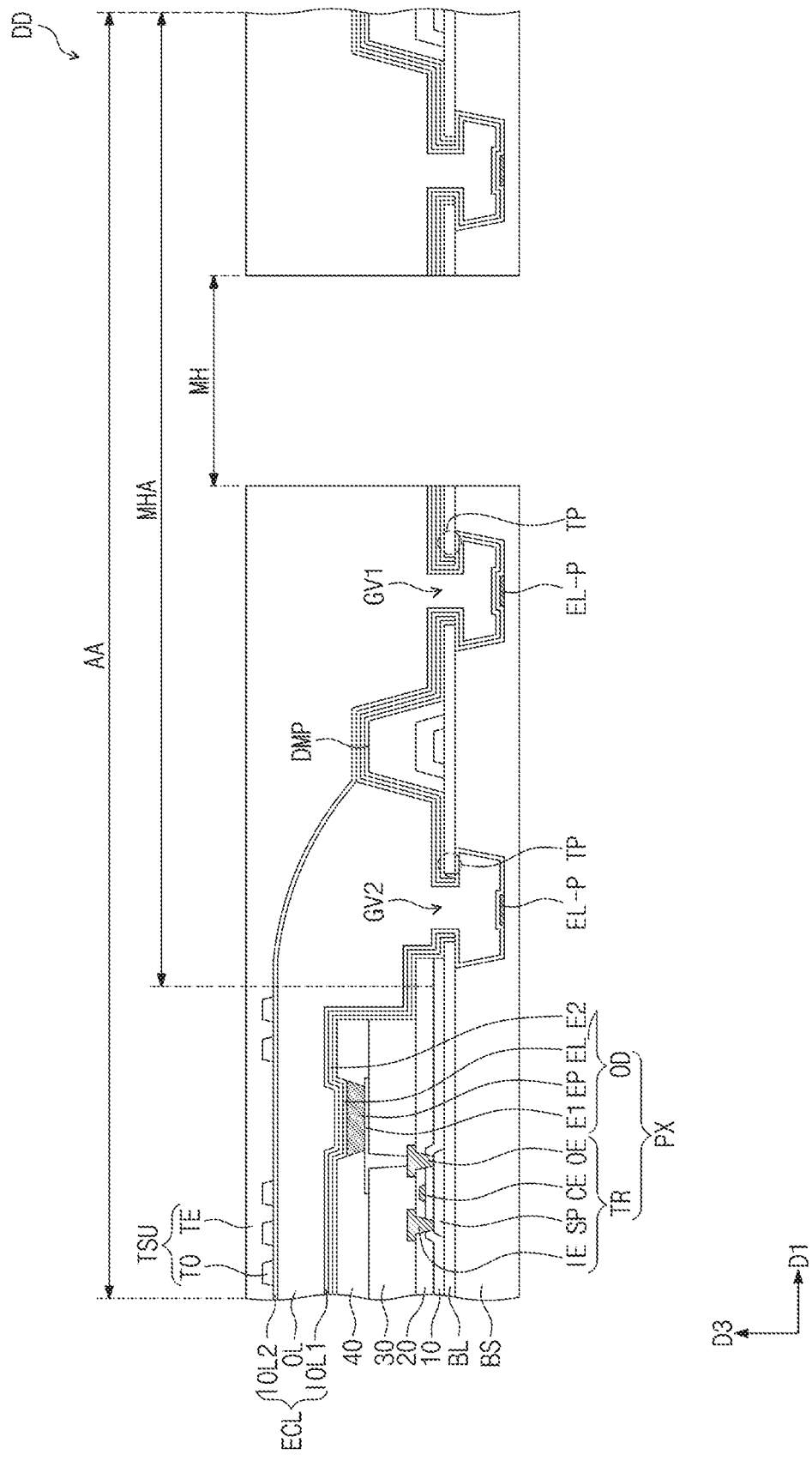
FIG. 2C is a cross-sectional view of a display unit according to an embodiment of the inventive concept.

FIG. 2A is a plan view schematically showing the region XX' of FIG. 1B. FIG. 2B and FIG. 2C are cross-sectional views of a display unit according to an embodiment of the inventive concept. Hereinafter, with reference to FIG. 2A-2C, embodiments of the inventive concept will be described. The same reference numerals are used to designate the same or substantially similar components as those described with reference to FIGS. 1A-1C, and redundant descriptions thereof may be omitted.

Referring to FIG. 2A and FIG. 2B, the display module DD includes a base layer BS, a plurality of signal lines SL1 and SL2, a plurality of pixels PX, insulation layers BL, 10, 20, 30, and 40, an encapsulation layer ECL, and a planarization layer PL.

The base layer BS may be provided as a base layer on which components of the display module DD are disposed. The base layer BS may include an insulation material. For example, the base layer BS may include a laminated film in which glass, a resin film, or an organic layer and an inorganic layer are alternately laminated.

The pixels PX each generate light, and the generated light is collected to implement the image IM (see, e.g., FIG. 1A) in the active area AA. Each of the pixels PX may be connected to a plurality of signal lines SL1 and SL2. In the illustrated embodiment, the first signal line SL1 and the second signal line SL2 from among the signal lines are exemplarily described. However, this is only an example, and each of the pixels PX according to an embodiment of the inventive concept may be additionally connected to various other signal lines and is not limited to any one embodiment.

The pixels PX are disposed on the base layer BS. According to an embodiment, between the pixels PX and the base layer BS, an auxiliary layer BL may be disposed. The auxiliary layer BL is directly disposed on the base layer BS to cover a front surface of the base layer BS.

The auxiliary layer BL includes an inorganic material. The auxiliary layer BL may include a barrier layer and/or a buffer layer. Accordingly, the auxiliary layer BL prevents or substantially prevents oxygen or moisture introduced through the base layer BS from penetrating into the pixels PX or provides a surface energy lower than the surface energy of the base layer BS such that the pixels PX may be stably formed.

At least one of the base layer BL and the auxiliary layer BL may be provided in plurality and laminated alternately with each other. In other embodiments, at least one of the barrier layer and the buffer layer, both part of (e.g., both constituting) the auxiliary layer BL, may be provided in plurality or omitted. However, these are only examples, and the display module DD according to an embodiment of the inventive concept may be provided to have various suitable configurations and is not limited to any one embodiment.

Each of the pixels PX may include a thin film transistor TR and a display element OD. The thin film transistor TR includes a semiconductor pattern SP, a control electrode CE, an input electrode IE, and an output electrode OE. The semiconductor pattern SP is disposed on the auxiliary layer BL. The semiconductor pattern SP may include a semiconductor material. The control electrode CE is spaced apart from the semiconductor pattern SP with a first insulation layer 10 interposed therebetween.

The input electrode IE and the output electrode OE are spaced apart from the control electrode CE with a second insulation layer 20 interposed therebetween. The input electrode IE and the output electrode OE pass through the first insulation layer 10 and the second insulation layer 20 and are connected to one side and the other side of the semiconductor pattern SP, respectively.

A third insulation layer 30 is disposed on the second insulation layer 20 and covers the input electrode IE and the output electrode OE. According to an embodiment of the inventive concept, the semiconductor pattern SP may be disposed on the control electrode CE. In other embodiments, the semiconductor patter SP may be disposed on the input electrode EI and the output electrode OE. In other embodiments, the input electrode IE and the output electrode OE may be disposed on the same layer as the semiconductor pattern SP and may be directly connected to the semiconductor pattern SP. The thin film transistor TR according to an embodiment of the inventive concept may be formed having various suitable configurations and is not limited to any one embodiment.

The display element OD is disposed on the third insulation layer 30. The display element OD may include various suitable elements as long as it can display (or emit) light. For example, the display element OD may include an organic light emitting element, an electrophoretic element, an electrowetting element, a liquid crystal capacitor, and the like. In the illustrated embodiment, the display element OD is exemplarily described as being an organic light emitting element. The display element OD includes a first electrode E1, a light emitting pattern EP, a control layer EL, and a second electrode E2.

The first electrode E1 may pass through the third insulation layer 30 to be connected to the thin film transistor TR. The display module DD may further include a separate connection electrode disposed between the first electrode E1 and the thin film transistor TR, and in this embodiment, the first electrode E1 may be electrically connected to the thin film transistor TR through the connection electrode.

A fourth insulation layer 40 is disposed on the third insulation layer 30. The fourth insulation layer 40 may be an inorganic layer and/or an organic layer and may have a single-layer structure or a multi-layer structure. An opening may be defined in the fourth insulation layer 40. The opening in the fourth insulation layer 40 exposes at least a portion of the first electrode E1. The fourth insulation layer 40 may be a pixel definition film.

The light emitting pattern EP is disposed in the opening defined in the fourth insulation layer 40. The light emitting pattern EP is disposed on the first electrode E1 exposed by the opening. The light emitting pattern EP may include a light emitting material. For example, the light emitting pattern EP may be include at least one material from among materials that emit red, green, and blue colors and may include a fluorescent material or a phosphorescent material. The light emitting pattern EP may include an organic light emitting material or an inorganic light emitting material. The light emitting pattern EP may emit light in response to a potential difference between the first electrode E1 and the second electrode E2.

The control layer EL is disposed between the first electrode E1 and the second electrode E2. The control layer EL is disposed adjacent to the light emitting pattern EP. The control layer EL controls the movement of charges to improve light emitting efficiency and lifespan of the light emitting element OD. The control layer EL may include at least one of a hole transport material, a hole injection material, an electron transport material, or an electron injection material.

In the illustrated embodiment, the control layer EL is illustrated as being disposed between the light emitting pattern EP and the second electrode E2; however, this is an example. The control layer EL may be disposed between the light emitting pattern EP and the first electrode E1 and may be provided as a plurality of layers laminated along the third direction D3 with the light emitting pattern EP interposed therebetween. In other embodiments, the control layer EL may be omitted.

The control layer EL may have an integrated (or continuous) shape extending from the active area AA to the peripheral area NAA. For example, the control layer EL may be commonly provided to a plurality of pixels.

The second electrode E2 is disposed on the control layer EL. The second electrode E2 may be opposite to the first electrode ELI. The second electrode E2 may have an integrated shape extending from the active area AA to the peripheral area NAA. For example, the second electrode E2 may be commonly provided to the plurality of pixels PX. The display element OD respectively disposed in each of the pixels PX receives a common power voltage (hereinafter, a second power voltage) through the second electrode E2.

The second electrode E2 may include a transmissive conductive material or a transflective conductive material. Accordingly, light generated by the light emitting pattern EP may be easily emitted in the third direction DR3 through the second electrode E2; however, this is an example. The display element OD according to another embodiment of the inventive concept may be driven, according to the design thereof, by a back surface light emitting method in which the first electrode E1 includes a transmissive or a transflective material, or may have a double-sided light emitting method in which light is emitted toward both front and back surfaces, but the display element OD is not limited to any one embodiment.

The encapsulation layer ECL is disposed on the display element OD and encapsulates the display element OD. The encapsulation layer ECL may be commonly provided to the plurality of pixels PX. In some embodiments, a capping layer, which covers the second electrode E2, may further be disposed between the second electrode E2 and the encapsulation layer ECL.

The encapsulation layer ECL may include a first inorganic layer IOL1, an organic layer OL, and a second inorganic layer IOL2, which are sequentially laminated along the third direction DR3. However, the inventive concept is not limited thereto, and the encapsulation layer ECL may further include a plurality of inorganic layers and organic layers.

The first inorganic layer IOL1 may cover the second electrode E2. The first inorganic layer IOL1 may prevent or substantially prevent external moisture or oxygen from penetrating into the display element OD. For example, the first inorganic layer IOL1 may include silicon nitride, silicon oxide, or a compound thereof. The first inorganic layer IOL1 may be formed through a deposition process.

The organic layer OL may be disposed on the first inorganic layer IOL1 to contact the first inorganic layer IOL1. The organic layer OL may provide a flat surface on the first inorganic layer IOL1. Bumps formed on an upper surface of the first inorganic layer IOL1, or particles present on the first inorganic layer IOL1, are covered by the organic layer OL so that the upper surface of the first inorganic layer IOL1 may not affect components or layers formed on the organic layer OL.

In addition, the organic layer OL may relieve stress between contacting layers. The organic layer OL may include an organic material and may be formed though a solution process, such as spin coating, slit coating, and ink jet processes.

The second inorganic layer IOL2 is disposed on the organic layer OL to cover the organic layer OL. The second inorganic layer IOL2 may be stably formed on the relatively flat surface of the organic layer OL rather than being disposed on the first inorganic layer IOL1. The second inorganic layer IOL2 encapsulates moisture and the like discharged from the organic layer OL to prevent the moisture from entering the outside. The second inorganic layer IOL2 may include silicon nitride, silicon oxide, or a compound thereof. The second inorganic layer IOL2 may be formed through a deposition process.

The planarization layer PL may be disposed on the encapsulation layer ECL. The planarization layer PL covers a front surface of the encapsulation layer ECL, which has a non-uniform (e.g., a non-level or non-flat) front surface, to provide a flat surface to the active area AA. However, this is an example. In the display module D according to other embodiments of the inventive concept, the planarization layer PL may be provided in plurality or may be omitted.

The module opening MH according to an embodiment of the inventive concept is defined in the active area AA. Accordingly, some of the pixels PX may be arranged along an edge of the module opening MH. In the illustrated embodiment, the module opening MH is defined through the front surface and the back surface of the display module DD. For example, the module opening MH may be formed through the base layer BS, the auxiliary layer BL, the first insulation layer 10, the second insulation layer 20, the control layer EL, the second electrode E2, the first inorganic layer IOL1, the second inorganic layer IOL2, and the planarization layer $PL_{[KWK1]}$. Accordingly, side surfaces respectively exposed by the base layer BS, the auxiliary layer BL, the first insulation layer 10, the second insulation layer 20, the control layer EL, the second electrode E2, the first inorganic layer IOL1, the second inorganic layer IOL2, and the planarization layer PL, all of which are penetrated, may by aligned with each other to define the module opening MH.

Some of the signal lines SL1 and SL2 may be disposed on an opening region (e.g., a hole region) MHA. In FIG. 2A, the first signal line SL1 and the second signal line SL2 from among the plurality of signal lines SL1 and SL2 are exemplarily described. In FIG. 2B, the signal lines SL1 and SL2 are not shown.

The first signal line SL1 extends in the first direction D1. The first signal line SL1 may extend in the first direction D1 around the module opening MH. The first signal line SL1 is connected to pixels in the same rows arranged along the first direction D1 from among the pixels PX. The second signal line SL1 may correspond to, for example, a gate line. The first signal line SL1 provides a gate signal for turning on the pixels PX.

Some of pixels connected to the first signal line SL1 are disposed on an upper side of the module opening MH, and the other pixels are disposed on a lower side of the module opening MH. Accordingly, pixels in the same row connected to the first signal line SL1 may be turned on/off by substantially the same gate signal even when some pixels are omitted around the center of the module hole MH.

The first signal line SL1 may be disposed on the same layer as the control electrode CE of the thin film transistor TR. The first signal line SL1 may be disposed between the first insulation layer 10 and the second insulation layer 20. However, the inventive concept is not limited thereto. The first signal line SL1 may be disposed on a different layer than the control electrode CE, and the arrangement of the first signal line SL1 is not limited to any one embodiment.

The second signal line SL2 may extend in the second direction D2. The second signal line SL2 may extend in the second direction D2 around the module opening MH. The second signal line SL2 is connected to pixels in the same column arranged along the second direction D2 from among the pixels PX. The second signal line SL2 may correspond to, for example, a data line. The second signal line SL2 provides a data signal to corresponding pixels.

The second signal line SL2 may be disposed on a different layer from the first signal line SL1. For example, the second signal line SL2 may be disposed on the same layer as the input electrode IE and the output electrode OE of the thin film transistor TE. For example, the second signal line SL2 is illustrated as being disposed between the second insulation layer 20 and the third insulation layer 30.

Some of pixels connected to the first signal line SL1 are disposed on a left side of the module opening MH, and other pixels connected to the first signal line SL1 are disposed on a right side of the module opening MH. Accordingly, pixels in the same row connected to the first signal line SL1 may receive a data signal through the same line even when some pixels are omitted around (e.g., near) the center of the module opening MH.

In the display module DD according to an embodiment of the inventive concept, the first signal line SL1 may correspond to the data line and the second signal line SL2 may correspond to the gate line. In other embodiments, the first signal line SL1 and the second signal line SL2 may be any one of a power line, an initialization voltage line, and a light emitting control line. In some embodiments, each of the pixels PX may be further connected to additional signal lines, but the inventive concept is not limited to any one embodiment.

The display module DD according to an embodiment may further include recessed patterns (e.g., grooves) GV1 and GV2 defined in the opening region MHA. The recessed patterns GV1 and GV2 may be defined along (e.g., may extend along) the edge of the module opening MH.

In the illustrated embodiment, each of the recessed patterns GV1 and GV2 may have a closed line shape surrounding (e.g., extending around) the module opening MH. For example, each of the recessed patterns GV1 and GV2 is illustrated as having a circular shape similar to the shape of the module opening MH. However, this is an example. The recessed patterns GV1 and GV2 may have a shape different than that of the module opening MH, such as a closed line shape including a square, an ellipse, or at least a portion of a curve, or a shape including a plurality of partially disconnected patterns (or portions). The recessed patterns GV1 and GV2 may have a different shapes, respectively.

The recessed patterns GV1 and GV2 are patterns recessed from the front surface of the display module DD and may be formed by removing some of the compositions of (e.g., some of the layers of) the display module DD. The recessed patterns GV1 and GV2 do not pass through (e.g., do not pass entirely through) the display module DD, different than the module opening MH. Accordingly, a back surface of the base layer BS overlapping the recessed patterns GV1 and GV2 is not opened by a recessed pattern GV (e.g., is not opened or penetrated by either of the recessed patterns GV1 and GV2).

The recessed patterns GV1 and GV2 may be formed through compositions adjacent to the module opening MH from among the remaining compositions disposed on a lower side of the encapsulation layer ECL, leaving a portion of the base layer BS.

In the illustrated embodiment, the recessed patterns GV1 and GV2 may be formed by connecting a through-portion of (e.g., an opening in) the auxiliary layer BL and a recessed portion of the base layer BS. The inner surface of the recessed pattern GV may be formed by covering the through-portion of the auxiliary layer BL and the recessed portion of the base layer BS by at least one of the first inorganic layer IOL1 and the second inorganic layer IOL2.

For example, a first recessed pattern GV1 may be disposed between a dam portion DMP and the module opening MH. The inner surface of the first recessed pattern GV1 may be formed by covering the through-portion of the auxiliary layer BL and the recessed portion of the base layer BS by the first inorganic layer IOL1 and the second inorganic layer IOL2. The inner surface (e.g., the inner area) of the first recessed pattern GV1 may be filled by the planarization layer PL.

A second recessed pattern GV2 may be disposed spaced apart from the first recessed pattern GV1 with the dam portion DMP interposed therebetween. The inner surface of the second recessed pattern GV2 may be formed by covering the through-portion of the auxiliary layer BL and the recessed portion of the base layer BS by the first inorganic layer IOL1. The inner surface (e.g., the inner area) of the second recessed pattern GV2 may be filled by the organic layer OL of the encapsulation layer ECL.

Each of the recessed patterns GV1 and GV2 may have an under-cut shape including a top portion protruding toward the inside (e.g., protruding toward a center of the recessed patterns GV1 and GV2). In the illustrated embodiment, the tip portion TP may be formed by a portion of the auxiliary layer BL protruding toward the inside of each of the recessed patterns GV1 and GV2 more than the sides of the base layer BS.

The display module DD may further include an organic pattern EL-P disposed inside of each of the recessed patterns GV1 and GV2. The organic pattern EL-P may include the same material as the control layer EL. In other embodiments, the organic pattern EL-P may include the same material as the second electrode E2 or the capping layer. The organic pattern EL-P may have a single-layer structure or a multi-layer structure.

The organic pattern EL-P may be disposed in the recessed pattern GV spaced apart from the control layer EL and the second electrode E2. The organic pattern EL-P may be covered by the first inorganic layer IOL1 and not exposed to the outside.

According to an embodiment of the inventive concept, the recessed patterns GV1 and GV2 block the continuity of the control layer EL (e.g., provide or form is discontinuity in the control layer EL) connected from a side surface of the module opening MH to the active area AA. The control layer EL may be disconnected in a region overlapping the recessed pattern GV. The control layer EM may serve as a movement path of external contaminants, such as moisture and air.

According to an embodiment of the inventive concept, a layer exposed by the module opening MH, for example, a path through which moisture or air may be introduced from the control layer EL through the opening region MHA to be introduced to the pixel PX may be blocked by the recessed patterns GV1 and GV2. Accordingly, the reliability of the display module DD formed with the module opening MH may be improved.

In the display module DD according to an embodiment of the inventive concept, at least one of the recessed patterns GV1 and GV2 may be omitted. In some embodiments, both of the recessed patterns GV1 and GV2 may be omitted, but the inventive concept is not limited to any one embodiment.

The dam portion DMP may defined a region in which a liquid organic material is spread in the process of forming the organic layer OL. The organic layer OL may be formed by an ink jet method in which a liquid organic material is applied on the first inorganic layer IOL1. The dam portion sets a boundary to a region in which the liquid organic material is applied and prevents the liquid organic material from overflowing to the outside of the dam portion DMP.

The dam portion DMP according to an embodiment may include a plurality of layers. For example, the dam portion DMP may be formed of a layer including the same materials as the material forming at least one of the insulation layers 10, 20, and 30. However, the inventive concept is not limited thereto. For example, the dam portion DMP may be provided as a single layer.

Referring to FIG. 2C, an input sensing unit TSU according to an embodiment of the inventive concept may be directly provided on the encapsulation layer ECL of the display module DD. However, this is an example. The input sensing unit TSU may be separately provided and coupled to the encapsulation layer ECL with an adhesive layer interposed therebetween, but the inventive concept is not limited to any one embodiment.

The input sensing unit TSU includes a sensing electrode TE disposed in the active area AA, sensing signal lines disposed in the peripheral area NAA, and a sensing organic layer TO covering the sensing electrode TE and the sensing signal lines. The sensing electrode TE according to an embodiment of the inventive concept may disposed not to overlap (e.g., may be offset from) the display element OD on a plane.

The input sensing unit TSU according to an embodiment may include a multi-layer input sensing unit or a single-layer input sensing unit. The input sensing unit TSU may sense an external input by a mutual cap method or a self-cap method.

The external input may include various forms of input provided from the outside of the electronic apparatus EA. The external input applied from the outside may be provided in various forms. For example, the external input may include not only contact by a part of a user's body, such as a hand, but also an external input applied in close proximity, or adjacent to, the electronic apparatus EA at a distance (e.g., hovering). Also, the external input may have various forms such as force, pressure, and light but is not limited to any one embodiment.

Figure 3A:
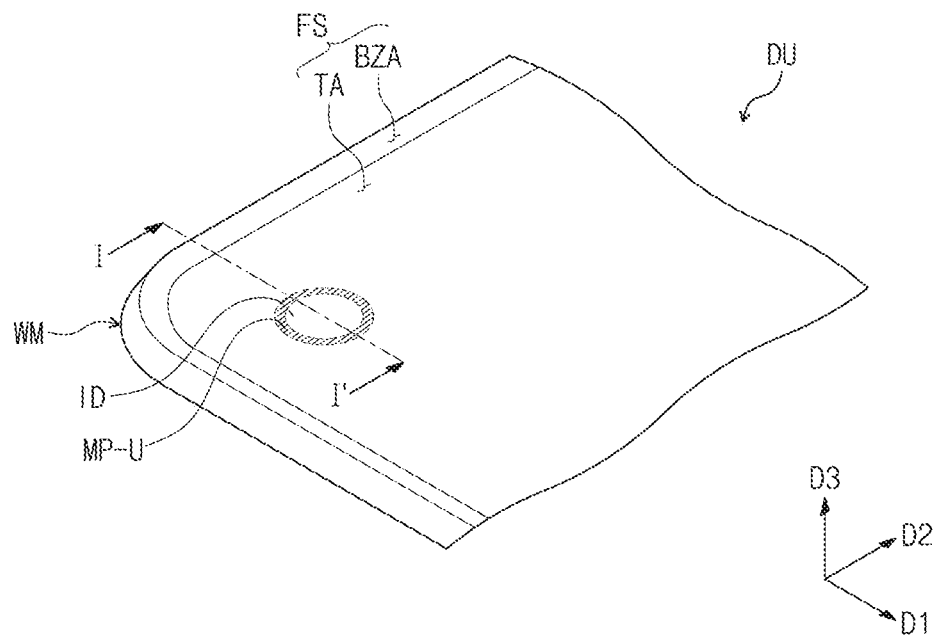
FIG. 3A is an enlarged view of a region of an electronic apparatus according to an embodiment of the inventive concept.
Figure 3B:
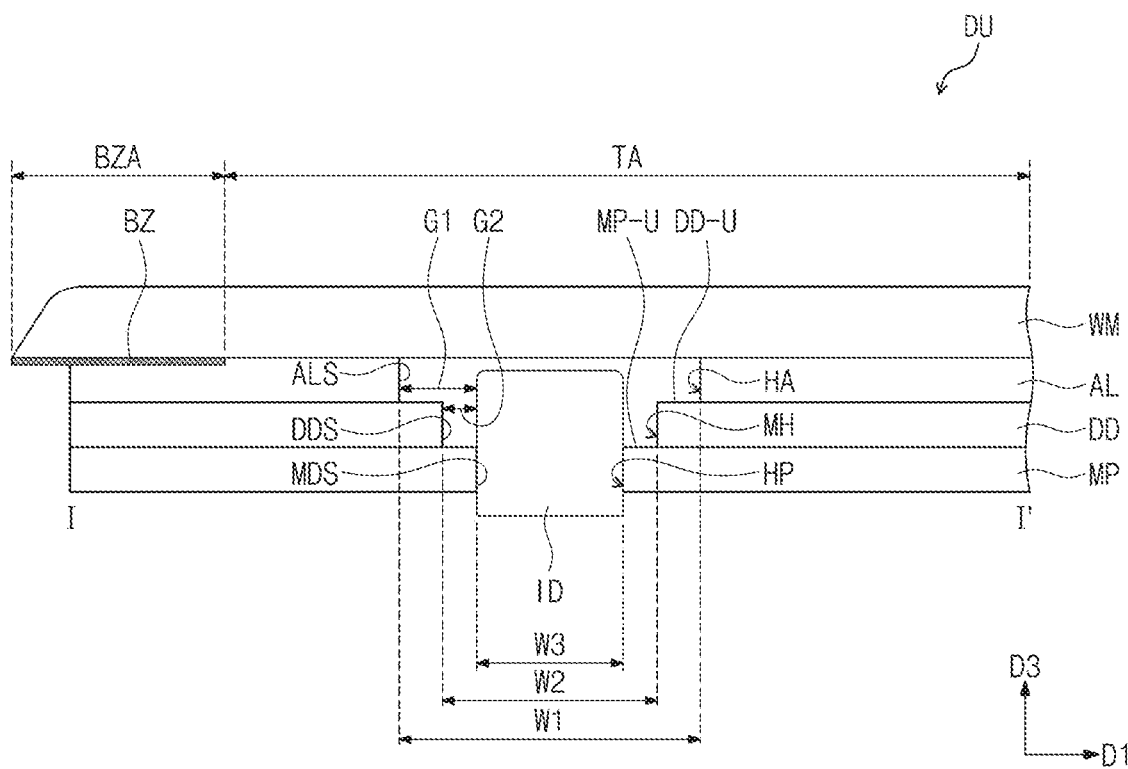
FIG. 3B is a cross-sectional view taken along the line I-I' in FIG. 3A.
Figure 3C:
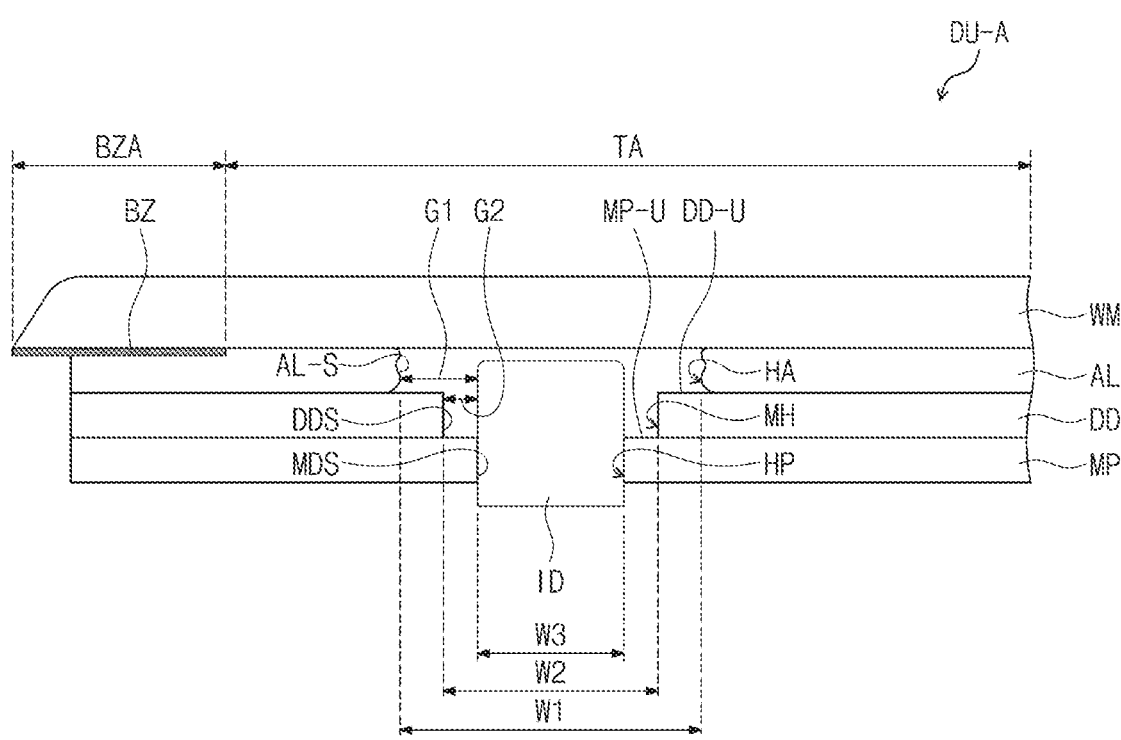
FIG. 3C is a cross-sectional view of a display module according to an embodiment of the inventive concept.

FIG. 3A is an enlarged view of a region of an electronic apparatus according to an embodiment of the inventive concept, FIG. 3B is a cross-sectional view taken along the line I-I' of FIG. 3A. FIG. 3C is a cross-sectional view of a display module according to an embodiment of the inventive concept. The same reference numerals designate the same or substantially similar components as those of FIGS. 1-2C, and redundant descriptions thereof may be omitted.

In FIG. 3A, a region of the display unit DU in which the electronic module ID is disposed is enlarged and shown. Also, the module opening MH overlapping the electronic module ID and the openings HA and HP are illustrated by shading.

Referring to FIG. 3B, the cover glass WM according to an embodiment may further include a bezel layer BZ. The bezel layer BZ may be defined the bezel area BZA. In the illustrated embodiment, a region of the cover glass EM in which the bezel layer BZ is disposed is defined as the bezel region, and a region exposed from the bezel layer BZ may be defined as the transmissive area TA.

The adhesive layer AL according to an embodiment defines the first opening HA. The first opening HA is defined by a first side surface ALS of the adhesive layer AL, which is the side surface exposed by the penetration of the adhesive layer AL. The first opening HA provides a space in which the electronic module ID is disposed.

The first opening HA is spaced apart from the electronic module ID. For example, the first side surface ALS defining the first opening HA is spaced apart from the electronic module ID by a first separation distance G1 in the first direction D1. The first opening HA has a first width W1 in the first direction D1.

The module opening MH is defined by a second side surface DDS of the display module DD exposed by the penetrated display module DD. For example, the second side surface DDS may be substantially a side surface of each of the base layer BS, the auxiliary layer BL, the first insulation layer 10, the second insulation layer 20, the control layer EL, the second electrode E2, the first inorganic layer IOL1, the second inorganic layer IOL2, and the planarization layer PL, as described above with reference to FIG. 2B. The module opening MH overlaps the first opening HA. The module opening MH overlaps the first opening HA and provides a space in which the electronic module ID is disposed.

The module opening MH is spaced apart from the electronic module ID. For example, the second side surface DDS defining the module opening MH is spaced apart from the electronic module ID by a second separation distance G2 in the first direction D1. The module opening MH has a second width W2 in the first direction D1.

The first separation distance G1 according to an embodiment of the inventive concept is greater than the second separation distance G2. Accordingly, the first width W1 is greater than the second width W2.

Because the first width W1 of the first opening HA is greater than the second width W2 of the module opening MH, a portion DD-U of the front surface of the display module DD adjacent to the module hole MH is exposed by the adhesive layer AL through the first opening HA.

The protective layer MP according to an embodiment defines the second opening HP. The second opening HP is defined by a third side surface MDS of the protective layer MP, which is the side surface exposed by the penetrated protective layer MP. The second opening HP has the electronic module ID inserted therein so that the electronic module ID may be stably fixed. For example, the third side surface MDS may contact the electronic module ID. Accordingly, the protective layer MP supports the electronic module ID so that the electronic module ID is not shaken in the display unit DU due to external impact.

The second opening HP has a third width W3 in the first direction D1. The second width W2 according to an embodiment of the inventive concept is greater than the third width W3.

Because the second width W2 of the module hole MH is greater than the third width W3 of the second opening HP, a portion MP-U of the front surface of the protective layer MP adjacent to the second opening HP is exposed by the protective layer MP through the second opening HP. The shaded region in FIG. 3A may be the portion MP-U of the front surface of the protective layer MP exposed through the display module DD through the module opening MH.

According to an embodiment of the inventive concept, because the module opening MH is spaced apart from the electronic module ID, the interference between the electronic module ID and the display module DD disposed in the active area AA may be reduced or minimized. Accordingly, by reducing or minimizing an impact applied to the display module DD from the electronic module ID, the electronic apparatus EA may have improved reliability.

Also, because the first separation distance G1 between the first opening HA and the electronic module ID defined in the adhesive layer AL is greater than the second separation distance G2 between the module opening MH and the electronic module ID, a problem in that the adhesive layer AL is introduced into the module opening MH may be prevented. Accordingly, the electronic apparatus EA may have improved reliability.

Referring to FIG. 3C, a first side surface AL-S defining the first opening HA according to an embodiment may have a non-uniform shape. For example, the first side surface AL-S may be deformed by pressure during a process of compressing the adhesive layer AL such that the first side surface AL-S may have a relatively non-uniform shape than the first side surface ALS shown in FIG. 3B.

Figure 4:
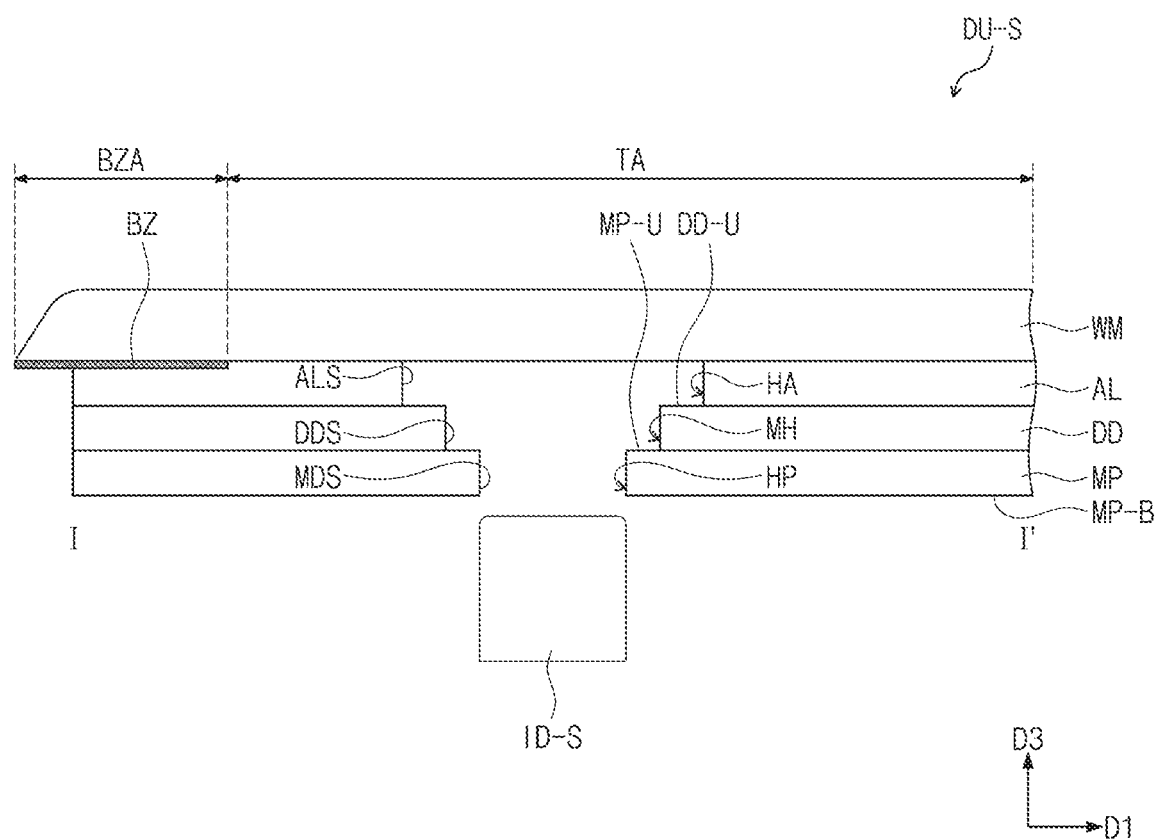
FIG. 4 is a cross-sectional view of a display module according to an embodiment of the inventive concept.

FIG. 4 is a cross-sectional view of a display module according to an embodiment of the inventive concept. Similar reference numerals are used to indicate same or substantially similar components as those shown in FIGS. 1A-3B, and redundant descriptions thereof may be omitted.

A display unit DU-S according to an embodiment of the inventive concept includes the cover glass WM, the display module DD, the adhesive layer AL, and the protective layer MP.

An electronic module ID-S according to an embodiment may be disposed on a lower portion of the display unit DU-S. For example, the electronic module ID-S is disposed on a back surface MP-B of the protective layer MP. Accordingly, different than the electronic module ID shown in FIG. 3B, the electronic module ID-S may not overlap (e.g., may be offset from) the first to third openings HA, MH, HP when viewed from the first direction D1.

However, the inventive concept is not limited thereto. The electronic module ID-S according to another embodiment may be arranged (or inserted) to overlap at least one opening from among the second opening HM and the third opening HP.

According to an embodiment, by including the electronic module ID-S disposed on the back surface MP-B of the protective layer MP, the interference between the electronic module ID-S and the adhesive layer AL, the display module DD, and the protective layer MP may be reduced or minimized. Also, because the electronic module ID-S, which is larger than the width of the third opening HP in the first direction D1, may be disposed on the back surface MP-B of the protective layer MP, the display unit DU may include various electronic modules ID-S regardless of the width of the third opening HP.

Figure 5A:
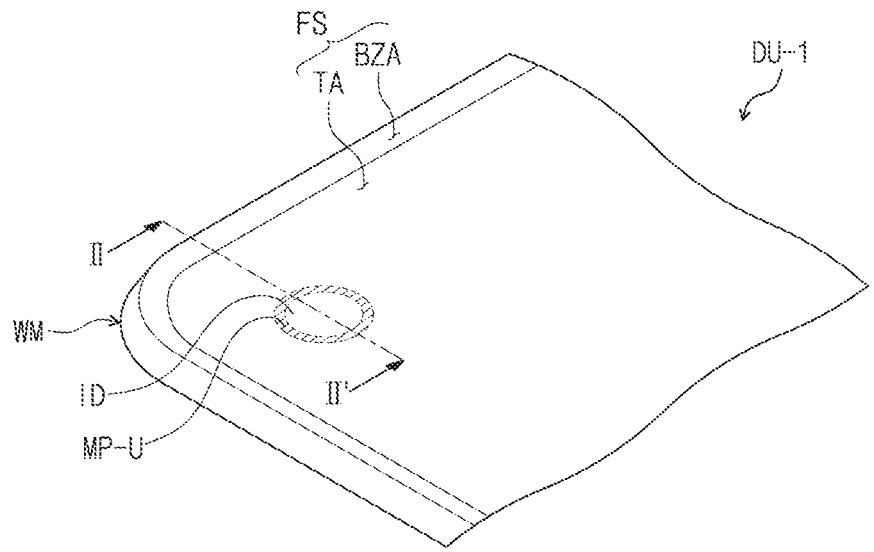
FIG. 5A is an enlarged view of a region of an electronic apparatus according to an embodiment of the inventive concept.
Figure 5B:
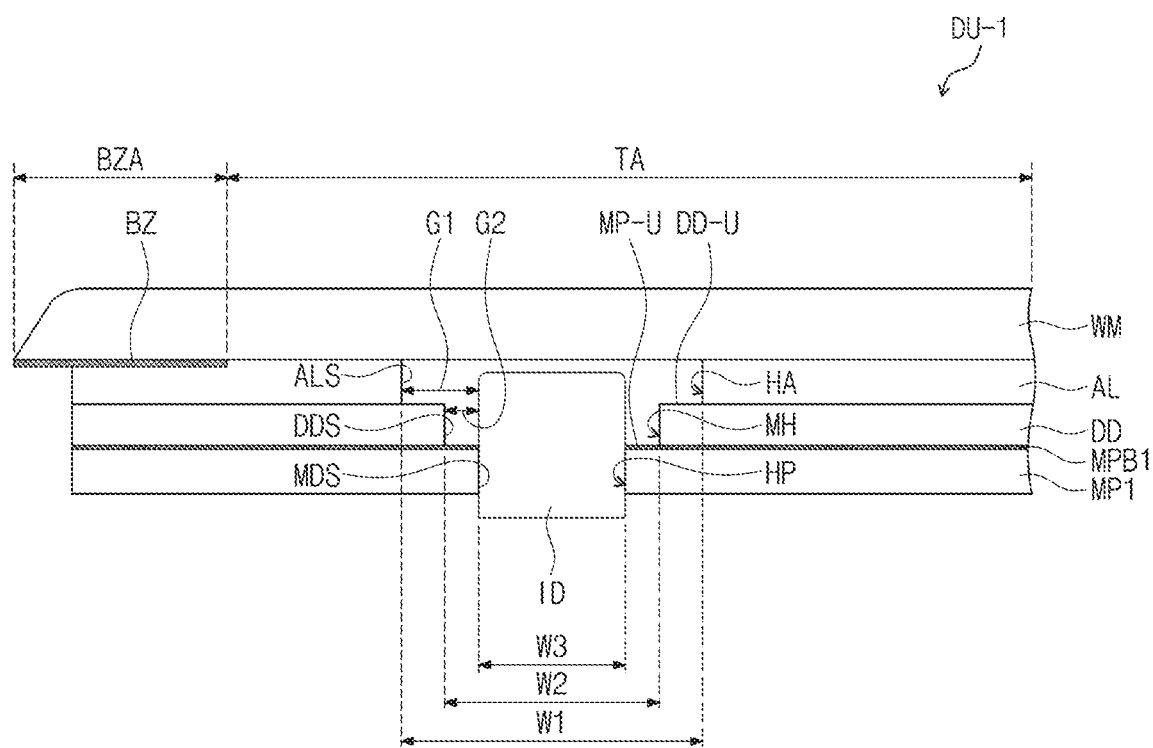
FIG. 5B is a cross-sectional view taken along the line II-II' in FIG. 5A.
Figure 6:
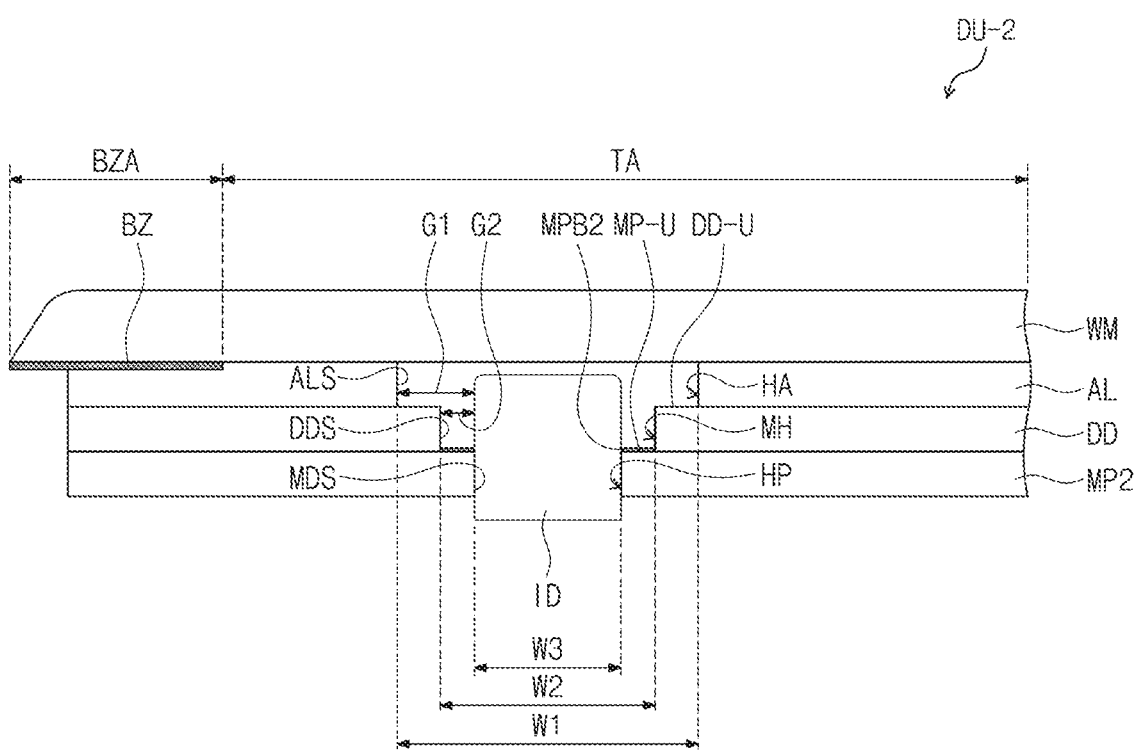
FIG. 6 is a cross-sectional view of a display module according to an embodiment of the inventive concept.

FIG. 5A is an enlarged view of a region of an electronic apparatus according to an embodiment of the inventive concept, and FIG. 5B is a cross-sectional view taken along the line II-II' in FIG. 5A. FIG. 5A shows a region corresponding to the region in FIG. 3A. FIG. 6 is a cross-sectional view of a display module according to an embodiment of the inventive concept. Similar reference numerals are used to indicate the same or substantially similar components as those shown in FIGS. 1A-3B, and redundant descriptions thereof may be omitted.

A protective layer MP1 of a display unit DU-1 according to an embodiment may further include a print layer MPB1. The print layer MPB1 is disposed on a front surface of the protective layer MP1 facing the display module DD.

The print layer MPB1 may be printed on the front surface of the protective layer MP1. Accordingly, the print layer MPB1 may cover the portion MP-U of the front surface of the protective layer MP exposed by the display module DD through the module opening MH. The print layer MPB1 may be printed in a color having high light blocking properties but is not limited to any one material as long as it is a suitable material having light blocking properties.

When the protective layer MP includes metal, the portion MP-U of the front surface of the protective layer MP reflects external light that may be viewed through the cover glass WM. Because the protective layer MP1 according to an embodiment further includes the print layer MPB1 printed on the front surface thereof, a problem in that the portion MP-U of the front surface of the protective layer MP is visible to the outside through the cover glass WM due to the reflection of external light may be mitigated.

Referring to FIG. 6, a protective layer MP2 of a display unit DU-2 according to an embodiment may further include a print layer MPB2. Different from the print layer MPB1 shown in FIG. 5B, the print layer MPB2 may be disposed on the portion MP-U of the front surface of the protective layer MP exposed by the display module DD through the module opening MH. The print layer MPB2 may be printed in a color having high light blocking properties and is not limited to any one material as long as it is a suitable material having light blocking properties.

Accordingly, a problem in that the portion MP-U of the front surface of the protective layer MP is visible to the outside through the cover glass WM due to the reflection of external light may be mitigated. Also, because the print layer MPB2 is printed in only one region of the protective layer MP, the process cost and time for forming the print layer MPB2 may be reduced.

Figure 7:
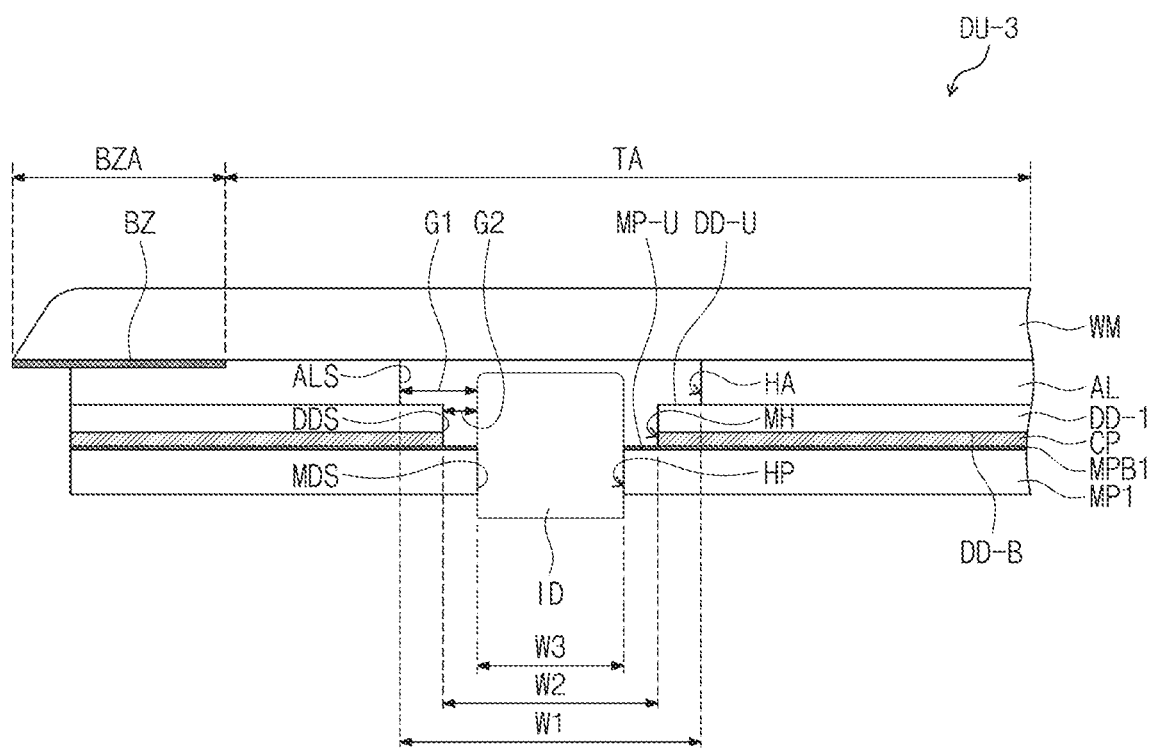
FIG. 7 is a cross-sectional view of a display module according to an embodiment of the inventive concept.
Figure 8:
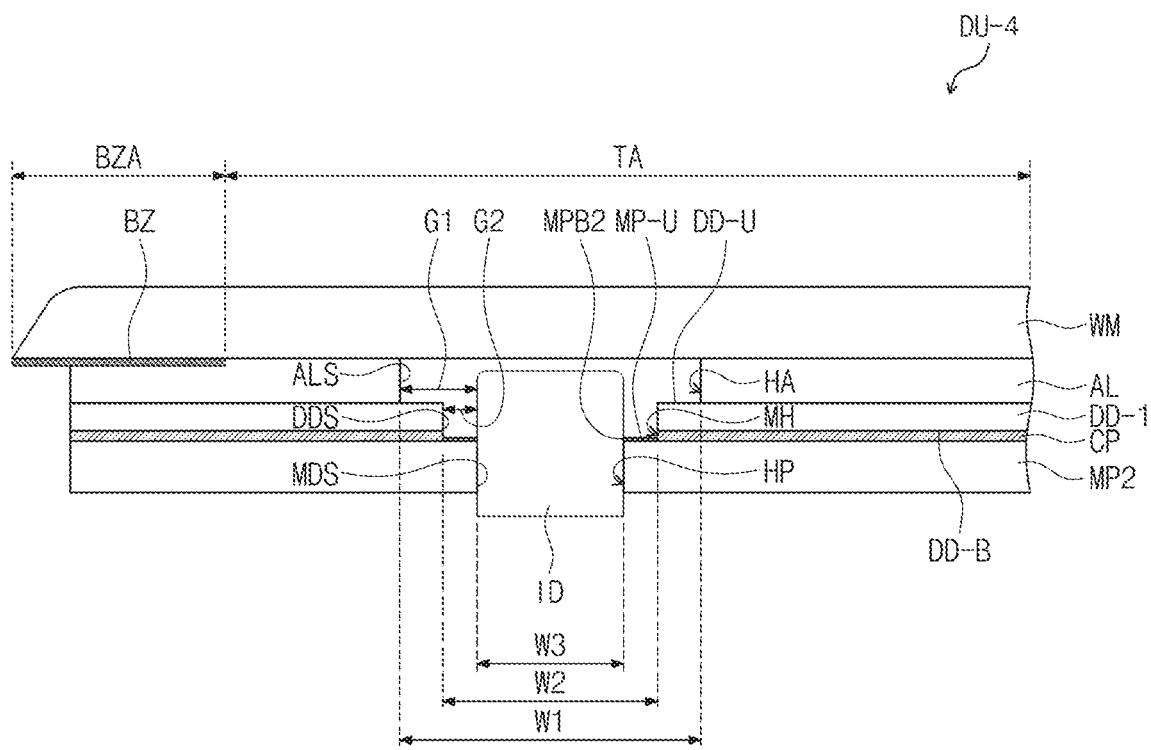
FIG. 8 is a cross-sectional view of a display module according to an embodiment of the inventive concept.

FIG. 7 is a cross-sectional view of a display module according to an embodiment of the inventive concept. FIG. 8 is a cross-sectional view of a display module according to an embodiment of the inventive concept. The same reference numerals are used to indicate the same components as those shown in FIGS. 1A-6, and redundant descriptions thereof may be omitted.

A display module DD-1 of a display unit DU-3 according to an embodiment may further include a cover layer CP. The cover layer CP is disposed on a back surface DD-B of the display module DD-1. The cover layer CP may be disposed between the display module DD-1 and the print layer MPB1. According to an embodiment, a portion of the print layer MPB1 may overlap the cover layer CP on a plane. The print layer MPB1 may be the same as the print layer MPB1 described above with reference to FIG. 5B.

The cover layer CP may include at least one functional layer for protecting the display module DD-1. For example, the cover layer CP may include a light blocking layer, a heat dissipating layer, a cushion layer, and a plurality of adhesive layers.

The light blocking layer may prevent components disposed on a back surface of the display module DD-1 from being projected on (e.g., visible through) the cover glass WM through the transmissive region TA. The light blocking layer may include a binder and a plurality of pigment particles dispersed therein. The pigment particles may include carbon black. Because the display unit DU-3 according to an embodiment includes the cover layer CP including the light blocking layer, improved light blocking properties may be achieved.

The heat dissipating layer may effectively dissipate heat generated in the display module DD-1. The heat dissipating layer may include at least one of graphite, copper (Cu) or aluminum (Al), both of which have good heat dissipating properties, but is not limited thereto. The heat dissipating layer not only improves heat dissipating properties but may also have electromagnetic wave shielding properties or electromagnetic wave absorbing properties.

The cushion layer may include (or may be) a synthetic resin foam. The cushion layer may include a matrix and/or a plurality of pores. The cushion layer may be elastic and/or may have a porous structure.

The matrix may include a flexible material. The matrix may include a synthetic resin. For example, the matrix may include at least one of acrylonitrile butadiene styrene copolymer (ABS), polyurethane (PU), polyethylene (PE), ethylene vinyl acetate (EVA), and/or polyvinyl chloride (PVC).

The plurality of pores easily absorb impact applied to the cushion layer. The plurality of pores may be defined in the cushion layer as a porous structure.

However, the inventive concept is not limited thereto. At least one of the light blocking layer, the heat dissipating layer, and/or the cushion layer may be omitted, or a plurality of layers may be provided as a single layer, but the inventive concept is not limited to any one embodiment.

Referring to FIG. 8, the display unit DU-3 according to an embodiment may include the print layer MPB2 and the cover layer CP. The print layer MPB2 may be disposed in only the portion MP-U of the front surface of the protective layer MP exposed by the display module DD through the module opening MH. The cover layer CP may be disposed on the back surface DD-B of the display module DD-1. Accordingly, the print layer MPB2 and the cover layer CP may not overlap (e.g., may be offset) on a plane.

Figure 9:
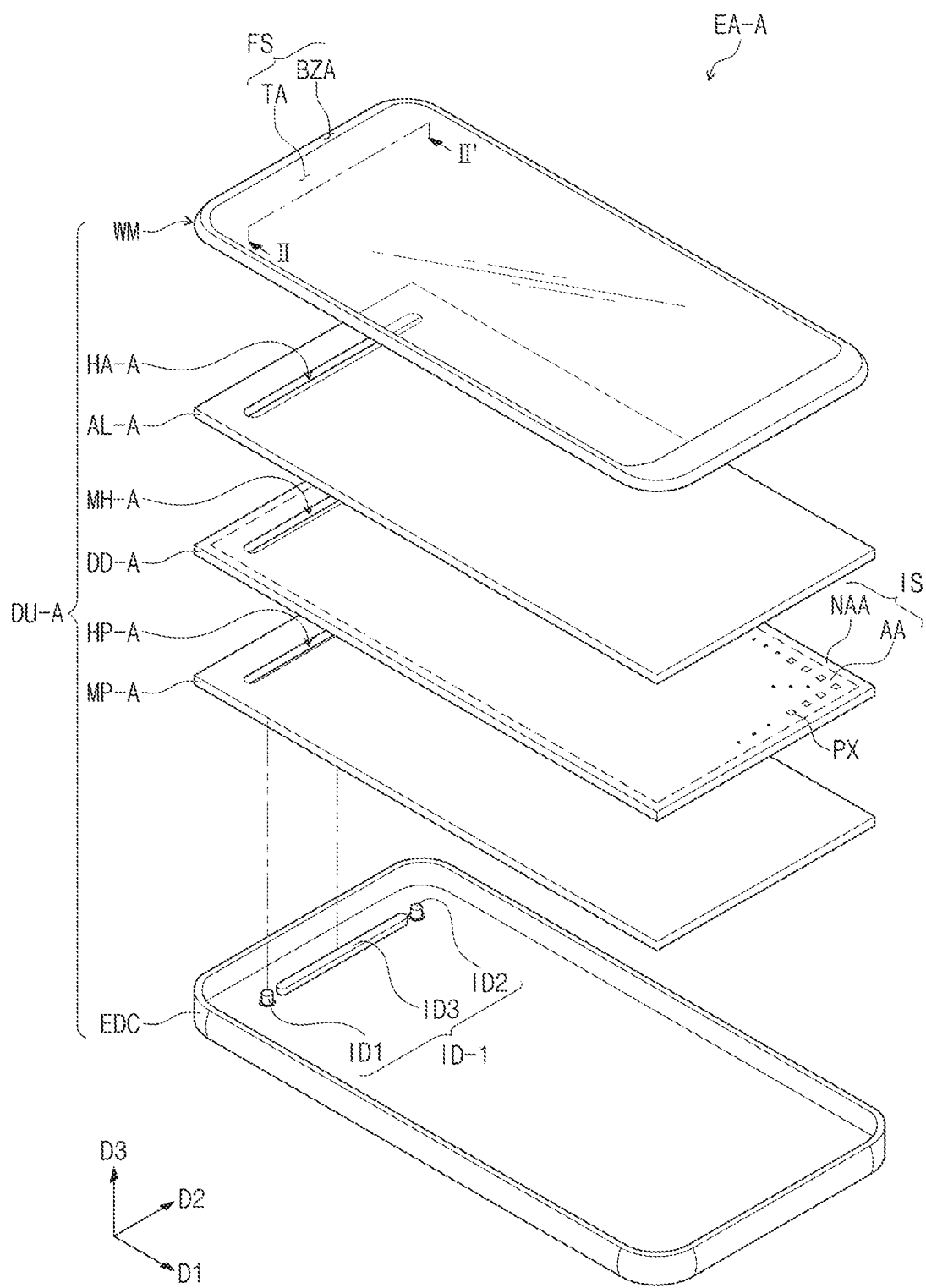
FIG. 9 is an exploded perspective view of an electronic apparatus according to an embodiment of the inventive concept.
Figure 10:
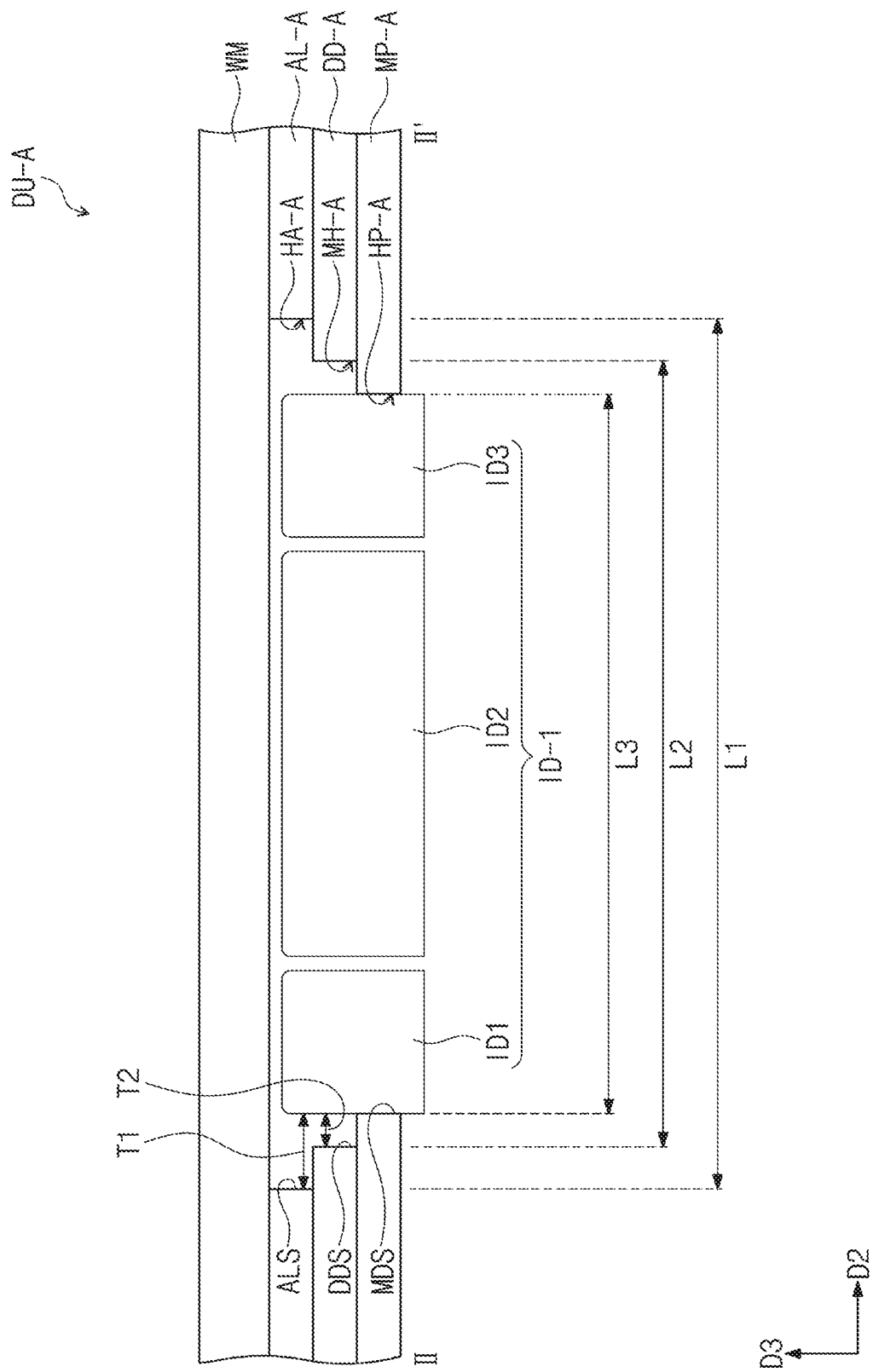
FIG. 10 is a cross-sectional view taken along the line II-II' in FIG. 9.

FIG. 9 is an exploded perspective view of an electronic apparatus according to an embodiment of the inventive concept, and FIG. 10 is a cross-sectional view taken along the line III-II' in FIG. 9. The same reference numerals are used to indicate the same or substantially similar components as those shown in FIGS. 1A-5B, and redundant descriptions thereof may be omitted.

Referring to FIGS. 9 and 10, an electronic module ID-1 of a display unit DU-A according to an embodiment of the inventive concept may be provided in plurality. For example, the electronic module ID-1 may include first to third electronic modules ID1, ID2, and ID3. The first to third electronic modules ID1, ID2, and ID3 may include at least one of the first electronic module EM1 and the second electronic module EM2 described above with reference to FIG. 1C. However, the inventive concept is not limited thereto. As long as the electronic module ID-1 is provided in plurality, the number thereof is not limited.

An adhesive layer AL-A according to an embodiment defines a first opening HA-A. The first opening HA-A may have a bar shape extending in the second direction D2.

The first opening HA-A is spaced apart from the electronic module ID-1. For example, the first side surface ALS defining the first opening HA-A is spaced apart from the electronic module ID-1 by a first separation distance T1 in the second direction D2. The first opening HA-A has a first width L1 in the second direction D2.

A display module DD-A defines a module opening (e.g., a module hole) MH-A. The module opening MH-A may have a bar shape extending in the second direction D2. The module opening MH-A overlaps the first opening HA-A on a plane.

The module opening MH-A is spaced apart from the electronic module ID-1. For example, the second side surface DDS defining the module opening MH-A is spaced apart from the electronic module ID-1 by a second separation distance T2 in the second direction D2. The module opening MH-A has a second width L2 in the second direction D2.

The first separation distance T1 according to an embodiment of the inventive concept is greater than the second separation distance T2. Accordingly, the first width L1 is greater than the second width L2.

A protective layer MP-A has a second opening HP-A defined therein. The second opening HP-A may have a bar shape extending in the second direction D2. The electronic module ID-1 is inserted into the second opening HP-A so that the electronic module ID-1 may be stably fixed.

The second opening HP has a third width L3 in the first direction D1. The second width L2 according to an embodiment of the inventive concept is greater than the third width L3.

According to an embodiment of the inventive concept, because the module opening MH-A is spaced apart from the electronic module ID-A, the interference between the electronic module ID-A and the display module DD-A disposed in the active area AA may be reduced or minimized. Accordingly, by reducing or minimizing an impact applied to the display module DD-A from the electronic module ID-A, an electronic apparatus EA-A may have improved reliability.

Because the first separation distance T1 between the first opening HA-A defined in the adhesive layer AL-A and the electronic module ID-1 is greater than the second separation distance T2 between the module opening MH-A and the electronic module ID-1, the adhesive layer AL-A may not be introduced into the module opening MH-A. Accordingly, the electronic apparatus EA-A may have improved reliability.

Also, because the plurality of electronic modules ID1, ID2, and ID3 are disposed in the active area AA, the electronic apparatus EA-A has a reduced (e.g., a relatively small) bezel area BZA.

Figure 11:
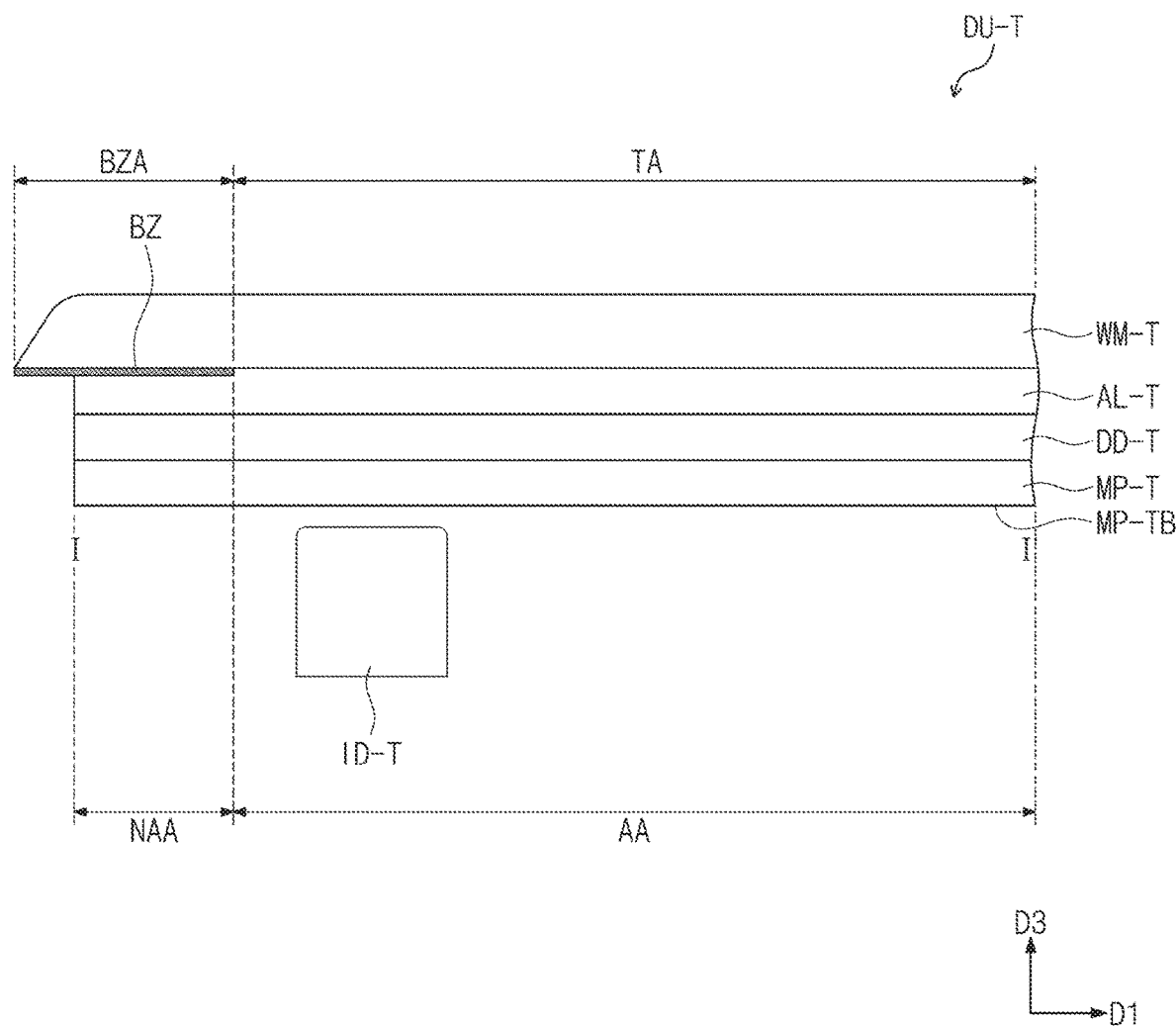
FIG. 11 is a cross-sectional view of a display module according to an embodiment of the inventive concept.

FIG. 11 is a cross-sectional view of a display module according to an embodiment of the inventive concept. Similar reference numerals are used to indicate the same or substantially similar components as those shown in FIGS. 1A-3B, and redundant descriptions thereof may be omitted.

A display unit DU-T according to an embodiment of the inventive concept includes a cover glass WM-T, a display module DD-T, an adhesive layer AL-T, and a protective layer MP-T. Different than the display unit DU described above with reference to FIGS. 1A-3B, in the display unit DU-T according to an embodiment, the openings HA, HM, and HP (see, e.g., FIG. 3B) into which an electronic module ID-T is inserted may be omitted.

The electronic module ID-T according to an embodiment may be disposed on a lower portion of the display unit DU-T. For example, the electronic module ID-T is disposed on a back surface MP-TB of the protective layer MP-T. The electronic module ID-T may be disposed to overlap the active area AA of the display module DD-T at the back surface MP-TB of the protective layer MP-T. According to an embodiment, in the display unit DU-T, any openings into which the electronic module ID-T may be inserted are omitted so that the display DU-T may have improved coupling force from among compositions of the display unit DU-T.

According to embodiments of the inventive concept, an adhesive layer disposed between a cover glass and a display module is spaced apart from an electronic module on a plane so that the adhesive layer is not introduced into the inside of the display module when the cover glass is attached to the display module.

In addition, a print layer for reflecting light incident from the outside may be further included in a protective layer for protecting the display module so that an electronic apparatus with improved reliability may be provided.

Although aspects and features of the inventive concept have been described with reference to example embodiments of the inventive concept, it will be understood by those skilled in the art that various changes in form and details may be made therein without departing from the spirit and scope of the inventive concept.

Accordingly, the technical scope of the inventive concept is not intended to be limited to the contents set forth in the detailed description of the specification but is defined in the appended claims and their equivalents.

What is claimed is:

1. An electronic apparatus comprising:
   an electronic module comprising at least one of a sound output module, a light emitting module, a light receiving module, or a camera module;
   a display module having an active area overlapping a pixel and a peripheral area adjacent to the active area, the display module having a front surface and a back surface opposite to the front surface, a module opening being defined in the display module from the back surface to the front surface in the active area and overlapping the electronic module;
   a cover glass having a transmissive area, at least a portion of which overlaps the active area, and a bezel area adjacent to the transmissive area and on the front surface of the display module;
   an adhesive layer between the display module and the cover glass and having a first opening overlapping the electronic module; and
   a protective layer on the back surface of the display module and having a second opening overlapping the electronic module,
   wherein the electronic module is spaced apart from the adhesive layer on a plane, and
   wherein a width in one direction of the module opening is greater than a width in one direction of the second opening, and the width in one direction of the module opening is smaller than a width in one direction of the first opening.

2. The electronic apparatus of claim 1, wherein a portion of the front surface adjacent to the module opening is exposed through the first opening in the adhesive layer.

3. The electronic apparatus of claim 1, wherein the protective layer comprises a print layer for reflecting light incident from the outside.

4. The electronic apparatus of claim 3, wherein the print layer is on a portion of a surface of the protective layer that is exposed through the module opening of the display module.

5. The electronic apparatus of claim 1, wherein the display module comprises a cover layer on the back surface of the display module, and
   wherein the cover layer comprises at least one of a light blocking layer, a heat dissipating layer, or a cushion layer.

6. The electronic apparatus of claim 1, wherein the module opening has a bar shape extending in one direction on a plane or a circular shape.

7. The electronic apparatus of claim 6, wherein the electronic module is provided in plurality, and
   wherein the electronic modules are spaced apart from each other in the module opening.

8. The electronic apparatus of claim 1, wherein the first opening is defined by a side surface of the adhesive layer that is exposed by the penetration of the first opening through the adhesive layer, and
   wherein the side surface has a non-uniform shape.

9. The electronic apparatus of claim 1, wherein the cover glass comprises a bezel layer in the bezel area.

10. The electronic apparatus of claim 1, wherein the adhesive layer comprises at least one of an optical clear adhesive (OCA), a pressure sensitive adhesive (PSA), or an optical clear resin (OCR).

11. The electronic apparatus of claim 1, further comprising an input sensing unit on the display module for sensing an external input, wherein the display module comprises a plurality of insulation layers on which the pixel is arranged, wherein the display module has a groove in the insulation layers in the thickness direction of the display module, and wherein the groove has a closed line shape extending around the module opening.

12. An electronic apparatus comprising:

a display module having an active area in which a pixel is arranged and a peripheral area adjacent to the active area, the display module having a front surface and a back surface opposite to the front surface, a module opening extending through the display module from the back surface to the front surface in the active area;

a cover glass having a transmissive area, at least a portion of which overlaps the active area, and a bezel area adjacent to the transmissive area and on the front surface of the display module;

an adhesive layer between the display module and the cover glass and having a first opening overlapping the module opening; and a protective layer on the back surface of the display module and having a second opening overlapping the module opening, wherein a width in one direction of the first opening is greater than a width in one direction of the module opening, and wherein a width in one direction of the module opening is greater than a width in one direction of the second opening, and the width in one direction of the module opening is smaller than a width in one direction of the first opening.

13. The electronic apparatus of claim 12, further comprising an electronic module overlapping the module opening, wherein the electronic module is spaced apart from the adhesive layer on a plane.

14. The electronic apparatus of claim 12, wherein a portion of the front surface adjacent to the module opening is exposed through the adhesive layer at the first opening.

15. The electronic apparatus of claim 12, wherein the protective layer comprises a print layer for reflecting light incident from the outside.

16. An electronic apparatus comprising:

a display module having an active area in which a pixel is arranged and a peripheral area adjacent to the active area and comprising a plurality of insulation layers on a base layer, the display module having a front surface and a back surface opposite to the front surface, a module opening being defined through the display module from the back surface to the front surface in the active area;

a cover glass having a transmissive area, at least a portion of which overlaps the active area, and a bezel area adjacent to the transmissive area and on the front surface of the display module;

an adhesive layer between the display module and the cover glass and having a first opening overlapping the module opening; and a protective layer on the back surface of the display module and having a second opening overlapping the module opening, wherein a portion of the front surface of the display module adjacent to the module opening is exposed through the adhesive layer at the first opening, wherein the display module has a groove in the insulation layers in the thickness direction of the display module, and wherein the groove has a closed line shape extending around the module opening between the module opening and the pixel.

17. The electronic apparatus of claim 16, wherein a width in one direction of the first opening is greater than a width in one direction of the module opening.

18. The electronic apparatus of claim 16, further comprising an electronic module overlapping the module opening, wherein the electronic module is spaced apart from the adhesive layer on a plane.

* * * * *